United States Patent
Holenstein et al.

(10) Patent No.: US 8,903,343 B2
(45) Date of Patent: Dec. 2, 2014

(54) SINGLE-INPUT MULTIPLE-OUTPUT AMPLIFIERS WITH INDEPENDENT GAIN CONTROL PER OUTPUT

(71) Applicant: QUALCOMM Incorporated, San Diego, CA (US)

(72) Inventors: Christian Holenstein, La Mesa, CA (US); Aleksandar Miodrag Tasic, San Diego, CA (US); Li-Chung Chang, Irvine, CA (US); Allen He, San Diego, CA (US); Rui Xu, San Diego, CA (US); Ehab Ahmed Sobhy Abdel Ghany, San Diego, CA (US); Wingching Vincent Leung, San Diego, CA (US); Ahmed Abdel Monem Youssef, San Diego, CA (US); Sang Hyun Woo, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/750,905

(22) Filed: Jan. 25, 2013

(65) Prior Publication Data

US 2014/0213209 A1    Jul. 31, 2014

(51) Int. Cl.
*H04B 1/06* (2006.01)
*H04B 1/16* (2006.01)
(Continued)

(52) U.S. Cl.
CPC .................. *H04B 1/16* (2013.01); *H04W 88/06* (2013.01); *H03G 3/30* (2013.01); *H03G 5/24* (2013.01); *H03F 1/0277* (2013.01); *H03F 1/223* (2013.01); *H03F 3/193* (2013.01); *H03F 3/68* (2013.01); *H03F 3/72* (2013.01); *H03F 2200/111* (2013.01); *H03F 2200/294* (2013.01); *H03F 2200/489* (2013.01); *H03F 2200/492* (2013.01); *H03F 2200/541* (2013.01)
USPC ................ 455/234.1; 455/245.1; 455/132; 455/553.1

(58) Field of Classification Search
CPC ............ H03G 3/30; H03G 5/24; H03G 5/26; H03F 1/223; H03F 3/72; H04B 1/0053; H04W 88/06
USPC ............ 455/552.1, 553.1, 132, 234.1, 240.1, 455/245.1; 330/295
See application file for complete search history.

(56) References Cited

U.S. PATENT DOCUMENTS 5,815,052 A * 9/1998 Nakajima et al. ............. 333/175
6,480,528 B1 * 11/2002 Patel et al. .................... 375/148
(Continued)

FOREIGN PATENT DOCUMENTS

WO        08103757        8/2008

OTHER PUBLICATIONS

Feng L., et al., "Overlapped inductors and its application on a shared RF front-end in a MultiStandard IC", 2011 IEEE Custom Integrated Circuits Conference (CICC), IEEE, Sep. 19, 2011, pp. 1-4, XP032063838, DOI: 1 0.11 09/CICC. 2011.6055390, ISBN: 978-1-4577-0222-8.

(Continued)

*Primary Examiner* — Duc M Nguyen
(74) *Attorney, Agent, or Firm* — Toler Law Group, PC

(57) ABSTRACT

Amplifiers with multiple outputs and separate gain control per output are disclosed. In an exemplary design, an apparatus (e.g., a wireless device or an integrated circuit) may include first and second amplifier circuits. The first amplifier circuit may receive and amplify an input radio frequency (RF) signal based on a first variable gain and provide a first amplified RF signal. The second amplifier circuit may receive and amplify the input RF signal based on a second variable gain and provide a second amplified RF signal. The input RF signal may include a plurality of transmitted signals being received by the wireless device. The first variable gain may be adjustable independently of the second variable gain. Each variable gain may be set based on the received power level of at least one transmitted signal being received by the wireless device.

20 Claims, 14 Drawing Sheets

(51) Int. Cl.
*H03F 1/02* (2006.01)
*H03F 1/22* (2006.01)
*H03F 3/193* (2006.01)
*H03F 3/68* (2006.01)
*H03F 3/72* (2006.01)
*H04W 88/06* (2009.01)
*H03G 3/30* (2006.01)
*H03G 5/24* (2006.01)

(56) References Cited

U.S. PATENT DOCUMENTS

| | | | |
|---|---|---|---|
| 7,023,272 B2* | 4/2006 | Hung et al. | 330/126 |
| 7,098,737 B2* | 8/2006 | Fujimoto et al. | 330/283 |
| 7,443,241 B2 | 10/2008 | Fong et al. | |
| 7,463,093 B2 | 12/2008 | Taylor et al. | |
| 7,482,879 B2 | 1/2009 | Koutani et al. | |
| 7,486,135 B2* | 2/2009 | Mu | 330/51 |
| 7,526,264 B2 | 4/2009 | Bargroff et al. | |
| 7,532,871 B2* | 5/2009 | Nishimura et al. | 455/130 |
| 7,634,244 B2 | 12/2009 | Burns et al. | |
| 7,800,450 B2 | 9/2010 | Park et al. | |
| 8,022,772 B2 | 9/2011 | Cassia et al. | |
| 8,180,312 B2 | 5/2012 | Brobston et al. | |
| 8,271,028 B2* | 9/2012 | Rabjohn | 455/552.1 |
| 2006/0084469 A1* | 4/2006 | Malone et al. | 455/552.1 |
| 2006/0189286 A1* | 8/2006 | Kyu et al. | 455/144 |
| 2007/0120605 A1* | 5/2007 | Bult et al. | 330/284 |
| 2011/0018635 A1 | 1/2011 | Tasic et al. | |
| 2011/0037518 A1* | 2/2011 | Lee et al. | 330/253 |
| 2011/0205984 A1* | 8/2011 | Lee et al. | 370/329 |
| 2011/0221531 A1* | 9/2011 | Kim et al. | 330/284 |
| 2012/0105157 A1 | 5/2012 | Ahn et al. | |

OTHER PUBLICATIONS

International Search Report and Written Opinion for International Application No. PCT/US2014/012509, ISA/EPO, Date of Mailing Apr. 14, 2014, 13 pages.

* cited by examiner

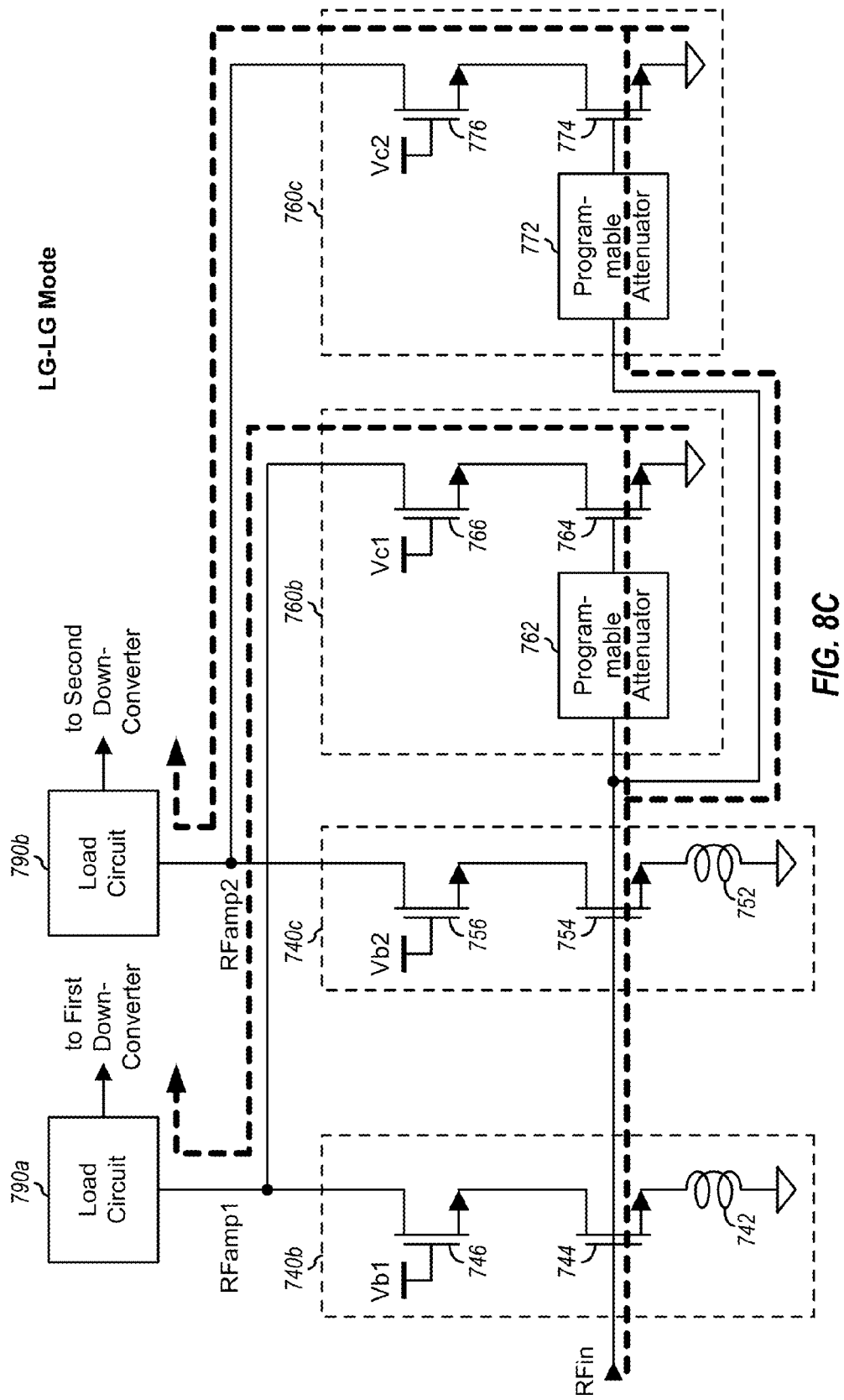

US 8,903,343 B2

SINGLE-INPUT MULTIPLE-OUTPUT AMPLIFIERS WITH INDEPENDENT GAIN CONTROL PER OUTPUT

BACKGROUND

I. Field

The present disclosure relates generally to electronics, and more specifically to amplifiers.

II. Background

A wireless device (e.g., a cellular phone or a smartphone) in a wireless communication system may transmit and receive data for two-way communication. The wireless device may include a transmitter for data transmission and a receiver for data reception. For data transmission, the transmitter may modulate a radio frequency (RF) carrier signal with data to obtain a modulated signal, amplify the modulated signal to obtain an output RF signal having the proper transmit power level, and transmit the output RF signal via an antenna to a base station. For data reception, the receiver may obtain a received RF signal via the antenna and may amplify and process the received RF signal to recover data sent by the base station.

A wireless device may receive multiple transmitted signals at different frequencies. The transmitted signals may travel via different propagation paths and may be received at different received power levels at the wireless device. It may be desirable to receive multiple transmitted signals with different received power levels such that good performance can be achieved for all transmitted signals being received.

BRIEF DESCRIPTION OF THE DRAWINGS

FIGS. 8A to 8C show three operating modes of the SIMO LNA in FIG. 7B.

DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

SIMO amplifiers with independent gain control per output are disclosed herein. These SIMO amplifiers may be used to receive multiple transmitted signals with independent gain control for different transmitted signals. These SIMO amplifiers may be used for various types of electronic devices such as wireless communication devices.

Figure 1:
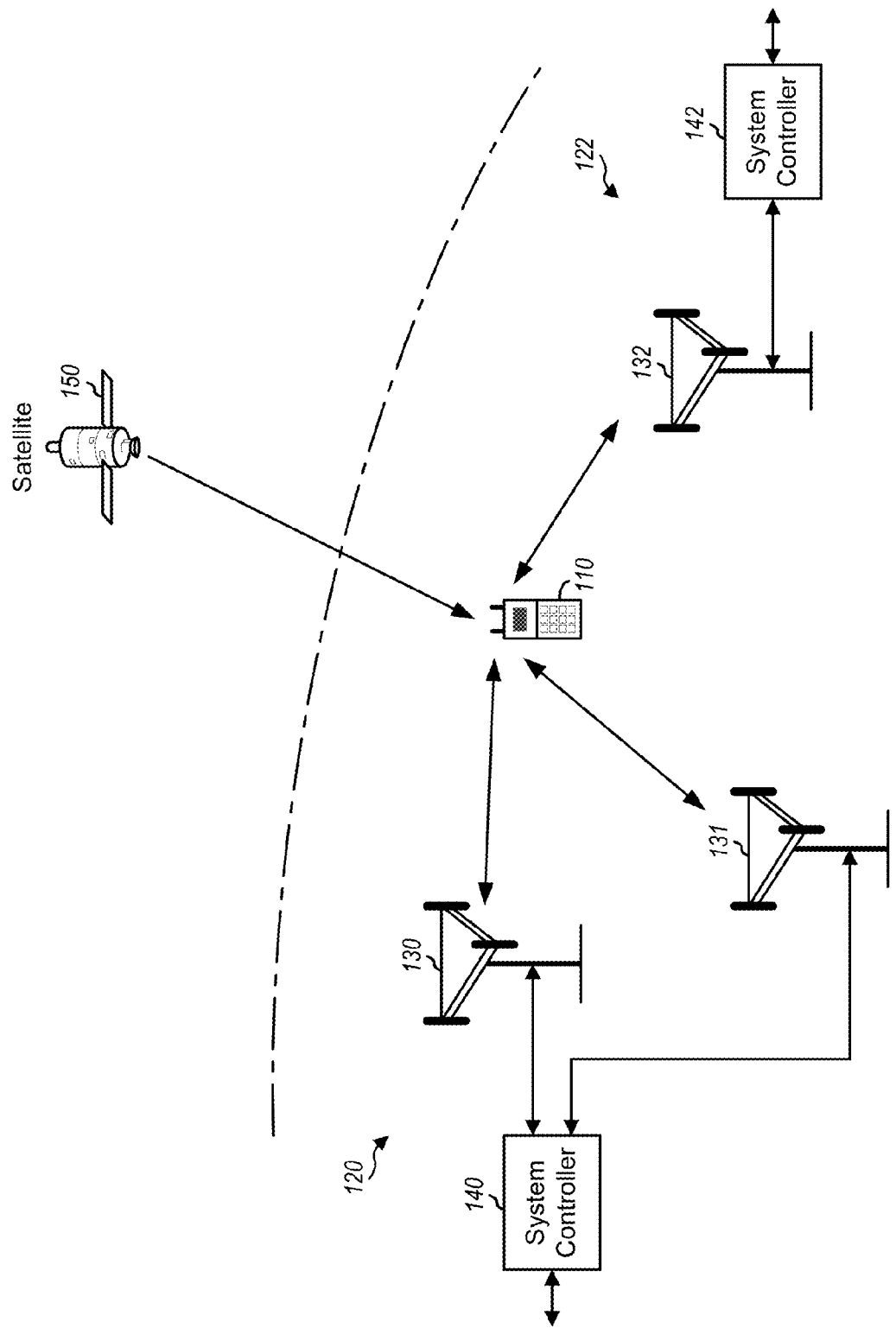
FIG. 1 shows a wireless device communicating with two wireless systems.

FIG. 1 shows a wireless device 110 communicating with wireless communication systems 120 and 122. Wireless systems 120 and 122 may each be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1X, Time Division Synchronous CDMA (TD-SCDMA), or some other version of CDMA. For simplicity, FIG. 1 shows wireless system 120 including two base stations 130 and 131 and one system controller 140, and wireless system 122 including one base station 132 and one system controller 142. In general, a wireless system may include any number of base stations and any set of network entities. A base station may also be referred to as a Node B, an evolved Node B (eNB), an access point, etc.

Wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may communicate with wireless system 120 and/or 122. Wireless device 110 may also receive signals from broadcast stations, signals from satellites (e.g., a satellite 150) in one or more global navigation satellite systems (GNSS), etc. Wireless device 110 may support one or more radio technologies for wireless communication such as LTE, WCDMA, CDMA 1X, TD-SCDMA, GSM, 802.11, etc. Wireless device 110 may communicate with one or more wireless systems at a given moment. For example, wireless device 110 may support concurrent communication with (i) a TD-SCDMA system and a CDMA, GSM or LTE system, or (ii) an LTE system and a GSM system, or (iii) a CDMA system and a GSM system, or (iv) some other combination of wireless systems.

Wireless device 110 may be able to operate in low-band (LB) covering frequencies lower than 1000 megahertz (MHz), mid-band (MB) covering frequencies from 1000 MHz to 2300 MHz, and/or high-band (HB) covering frequencies higher than 2300 MHz. For example, low-band may cover 698 to 960 MHz, mid-band may cover 1475 to 2170 MHz, and high-band may cover 2300 to 2690 MHz and 3400 to 3800 MHz. Low-band, mid-band, and high-band refer to three groups of bands (or band groups), with each band group including a number of frequency bands (or simply, "bands"). LTE Release 11 supports 35 bands, which are referred to as LTE/UMTS bands and are listed in a publicly available document 3GPP TS 36.101. In general, any number of band groups may be defined. Each band group may cover any range of frequencies, which may or may not match any of the frequency ranges given above. Each band group may include any number of bands.

Wireless device 110 may support carrier aggregation, which is operation on multiple carriers. Carrier aggregation may also be referred to as multi-carrier operation. A carrier may refer to a range of frequencies used for communication and may be associated with certain characteristics. For example, a carrier may be associated with system information and/or control information describing operation on the carrier. A carrier may also be referred to as a component carrier (CC), a frequency channel, a cell, etc. A band may include one or more carriers. Each carrier may cover up to 20 MHz in LTE. Wireless device 110 may be configured with up to 5 carriers in one or two bands in LTE Release 11.

In general, carrier aggregation (CA) may be categorized into two types—intra-band CA and inter-band CA. Intra-band CA refers to operation on multiple carriers within the same band. Inter-band CA refers to operation on multiple carriers in different bands.

Figure 2:
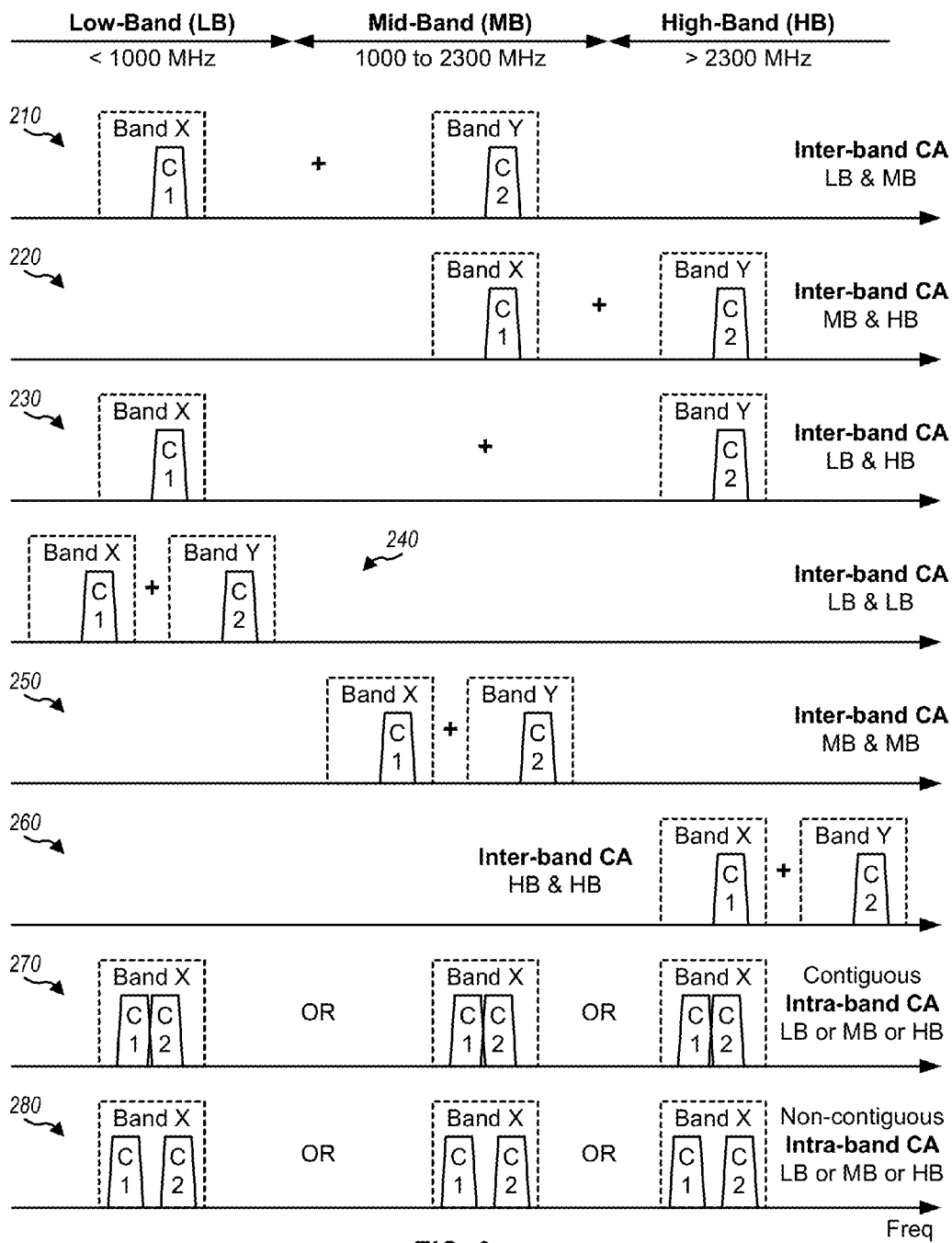
FIG. 2 shows various examples of carrier aggregation (CA).

FIG. 2 shows various CA scenarios that may be supported by wireless device 110. For simplicity, FIG. 2 shows wireless device 110 being configured with only one carrier in a band for inter-band CA. In general, wireless device 110 may be configured with one or more carriers in a given band.

Scenario 210 covers inter-band CA with one carrier C1 in band X in low-band and one carrier C2 in band Y in mid-band being configured for wireless device 110. Scenario 220 covers inter-band CA with one carrier C1 in band X in mid-band and one carrier C2 in band Y in high-band being configured for wireless device 110. Scenario 230 covers inter-band CA with one carrier C1 in band X in low-band and one carrier C2 in band Y in high-band being configured for wireless device 110.

Scenario 240 covers inter-band CA with one carrier C1 in band X in low-band and one carrier C2 in band Y also in low-band being configured for wireless device 110. Scenario 250 covers inter-band CA with one carrier C1 in band X in mid-band and one carrier C2 in band Y also in mid-band being configured for wireless device 110. Scenario 260 covers inter-band CA with one carrier C1 in band X in high-band and one carrier C2 in band Y also in high-band being configured for wireless device 110.

Scenario 270 covers contiguous intra-band CA with two adjacent carriers C1 and C2 in band X in low-band, or mid-band, or high-band being configured for wireless device 110. Scenario 280 covers non-contiguous intra-band CA with two non-adjacent carriers C1 and C2 in band X in low-band, or mid-band, or high-band being configured for wireless device 110.

FIG. 2 shows some examples of carrier aggregation. Carrier aggregation may also be supported for other combinations of bands and band groups. Carrier aggregation may also be supported for various radio technologies such as LTE, UMTS, etc. Carrier aggregation for UMTS may be referred to as multi-carrier UMTS.

FIG. 2 may also be applicable for dual SIM/dual standby (DSDS) and dual SIM/dual-active (DSDA). In this case, multiple carriers may be received from different wireless systems such as TD-SCDMA and GSM systems, or LTE and GSM systems, or CDMA and GSM systems, etc.

Figure 3:
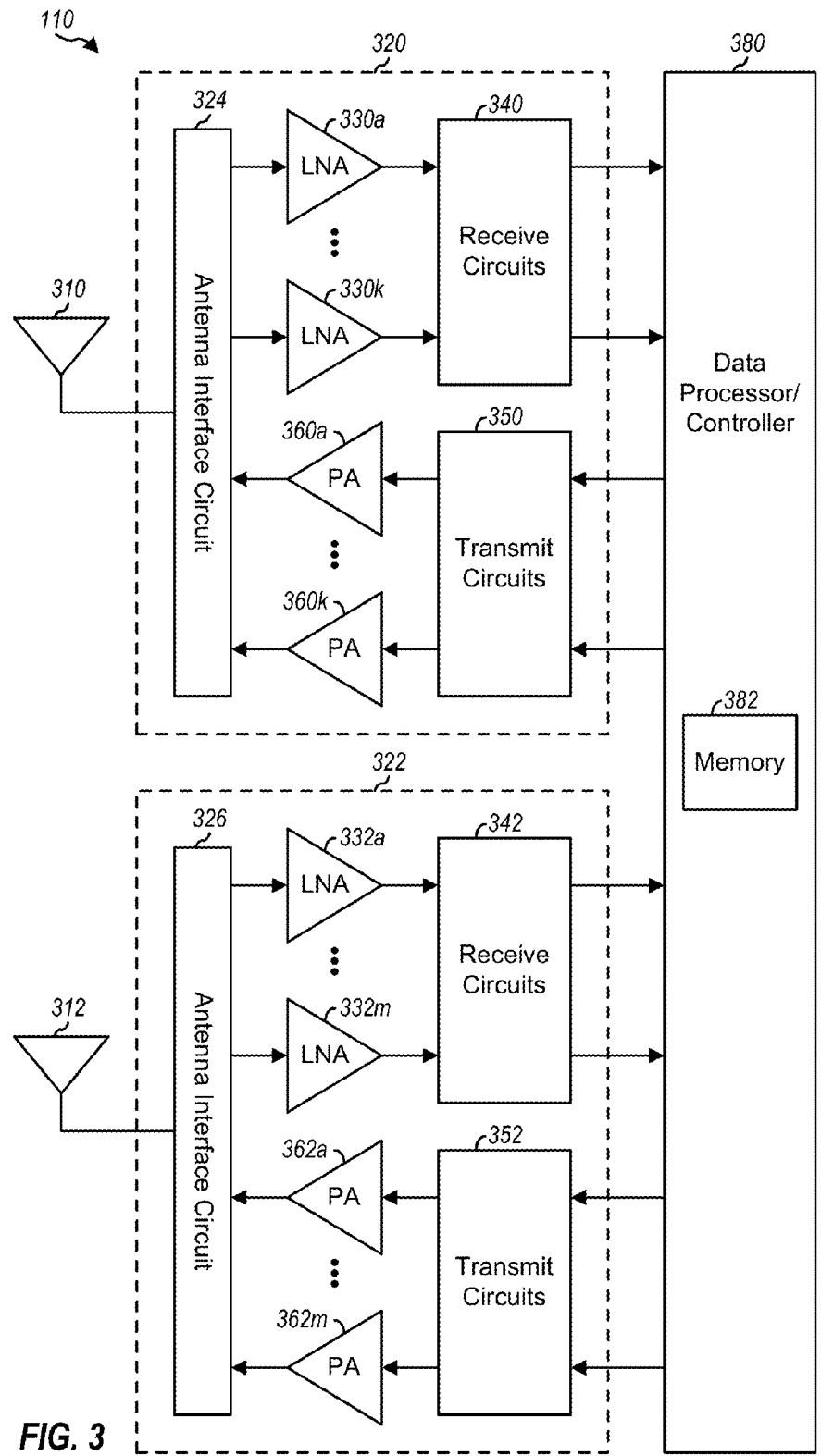
FIG. 3 shows a block diagram of the wireless device in FIG. 1.

FIG. 3 shows a block diagram of an exemplary design of wireless device 110 in FIG. 1. In this exemplary design, wireless device 110 includes a transceiver 320 coupled to a primary antenna 310, a transceiver 322 coupled to a secondary antenna 312, and a data processor/controller 380. Transceiver 320 includes an antenna interface circuit 324, multiple (K) LNAs 330a to 330k, receive circuits 340, transmit circuits 350, and K power amplifiers (PAs) 360a to 360k. Transceiver 322 includes an antenna interface circuit 326, multiple (M) LNAs 332a to 332m, receive circuits 342, transmit circuits 352, and M PAs 362a to 362m. Transceivers 320 and 322 may support multiple frequency bands, carrier aggregation, multiple radio technologies, receive diversity, multiple-input multiple-output (MIMO) transmission from multiple transmit antennas to multiple receive antennas, etc.

For data reception, antenna 310 receives signals from base stations and/or other transmitter stations and provides a received RF signal, which is routed through antenna interface circuit 324 and provided as an input RF signal to a selected LNA 330. Antenna interface circuit 324 may include switches, duplexers, diplexers, transmit filters, receive filters, matching circuits, etc. The selected LNA 330 amplifies the input RF signal and provides one or more amplified RF signals via one or more LNA outputs to receive circuits 340. The amplified RF signal from each LNA output may be independently gain controlled to obtain the desired amplitude, as described below. Receive circuits 340 downconvert each amplified RF signal from RF to baseband, filter and amplify each downconverted signal, and provide one or more analog input signals to data processor 380. Receive circuits 340 may include mixers, filters, amplifiers, matching circuits, oscillators, local oscillator (LO) generators, phase locked loops (PLLs), etc.

For data transmission, data processor 380 processes (e.g., encodes and modulates) data to be transmitted and provides one or more analog output signals to transmit circuits 350. Transmit circuits 350 amplify, filter, and upconvert each analog output signal from baseband to RF and provide a modulated signal to a selected PA 360. Transmit circuits 350 may include amplifiers, filters, mixers, matching circuits, oscillators, LO generators, PLLs, etc. The selected PA 360 amplifies the modulated signal and provides an output RF signal having the proper transmit power level. The output RF signal is routed through antenna interface circuit 324 and transmitted via antenna 310.

LNAs 332, receive circuits 342, transmit circuits 352, and PAs 362 within transceiver 322 may operate in similar manner as LNAs 330, receive circuits 340, transmit circuits 350, and PAs 360 within transceiver 320. Transceivers 320 and 322 may also include other circuits not shown in FIG. 3. All or a portion of transceivers 320 and 322 may be implemented on one or more analog integrated circuits (ICs), RF ICs (RFICs), mixed-signal ICs, etc. For example, LNAs 330 and receive circuits 340 may be implemented on one or more modules, which may comprise an RFIC or multiple RFICs, etc. The circuits in transceivers 320 and 322 may also be implemented in other manners.

Data processor/controller 380 may perform various functions for wireless device 110. For example, data processor 380 may perform analog-to-digital signal conversion, processing for data being received via receiver circuits 340 and 342, and processing for data being transmitted via transmit circuits 350 and 352. Controller 380 may control the operation of various circuits within transceivers 320 and 322. A memory 382 may store program codes and data for data processor/controller 380. Data processor/controller 380 may be implemented on one or more application specific integrated circuits (ASICs) and/or other ICs. Data processor/controller 380 and RF circuits may also be implemented on the same IC.

Wireless device 110 may concurrently receive multiple transmitted signals at different frequencies. These multiple transmitted signals may be sent by one or more base stations on different frequencies at the same or different transmit power levels. These multiple transmitted signals may also be sent based on the same or different radio technologies such as LTE, GSM, CDMA, etc. Each transmitted signal may travel via a particular propagation path and may be received at a particular received power level at wireless device 110. The multiple transmitted signals may travel via different propagation paths and may be received at different received power levels by wireless device 110.

Figure 4:
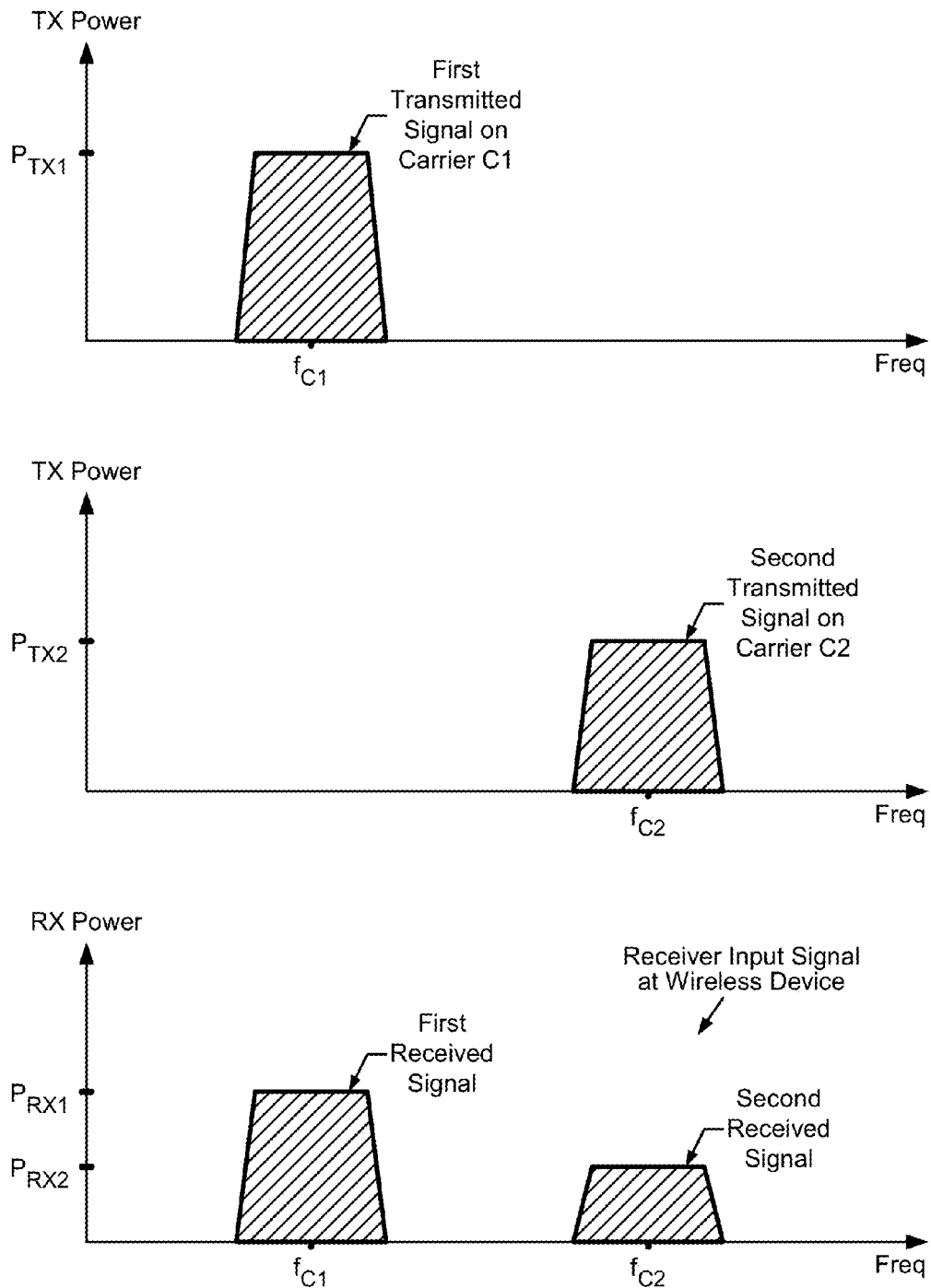
FIG. 4 shows transmission and reception of multiple transmitted signals.

FIG. 4 shows exemplary transmission and reception of two transmitted signals. A first transmitted signal may be sent to wireless device 110 on a first carrier C1 at a first transmit power level of $P_{TX1}$. A second transmitted signal may be sent to wireless device 110 on a second carrier C2 at a second transmit power level of $P_{TX2}$, which may or may not be equal to $P_{TX1}$. Carriers C1 and C2 may be adjacent to each other in frequency or may be separate from each other. The first and second transmitted signals may be sent by one or more base stations to wireless device 110 for (i) concurrent transmissions sent on multiple carriers at different frequencies for carrier aggregation, or (ii) concurrent voice and data from the same wireless system (e.g., an LTE system or a 1X/EVDO system), or (iii) concurrent transmissions from different wireless systems (e.g., GSM and CDMA 1x), or (iv) concurrent transmissions from different base stations in the same wireless system for coordinated multi-point (CoMP), or (v) concurrent transmissions of other types.

Antenna 310 at wireless device 110 may receive the two transmitted signals and may provide an input RF signal comprising one or more received signals for each transmitted signal. Each received signal may correspond to a version of a transmitted signal received via a particular propagation/signal path. For simplicity, the description below assumes that one received signal is obtained for each transmitted signal via one propagation path. The two transmitted signals may travel via different propagation paths and may be received at different received power levels at wireless device 110. Wireless device 110 may obtain (i) a strong received signal for a transmitted signal with a small pathloss and (ii) a weak received signal for a transmitted signal with a large pathloss.

A single receiver comprising a single LNA and a single downconverter at wireless device 110 may be used to concurrently process the two transmitted signals being received. This receiver may be provided with an input RF signal comprising at least one received signal for each transmitted signal. If a high gain is used for the LNA in the receiver, then some circuit blocks (e.g., baseband filters, analog-to-digital converters (ADCs), etc.) in the receiver may saturate or clip either due to a strong received signal or its adjacent channel interference (ACI). Conversely, if a low gain is used, then low sensitivity may be obtained for a weak received signal, and performance may be poor for the weak received signal.

In an aspect of the present disclosure, wireless device 110 may process multiple transmitted signals with a SIMO LNA having separate gain control for each LNA output, e.g., each transmitted signal. The multiple transmitted signals may be sent concurrently to wireless device 110. Wireless device 110 may perform gain control separately for each set of at least one transmitted signal being received and processed via a separate receive circuit at wireless device 110. This may enable wireless device 110 to use a low gain for a strong received signal and a high gain for a weak received signal, which may avoid the problems related to saturation and low sensitivity due to a single gain used for all transmitted signals, as described above. Separate gain control for different sets of at least one transmitted signal may be implemented in various manners.

Figure 5:
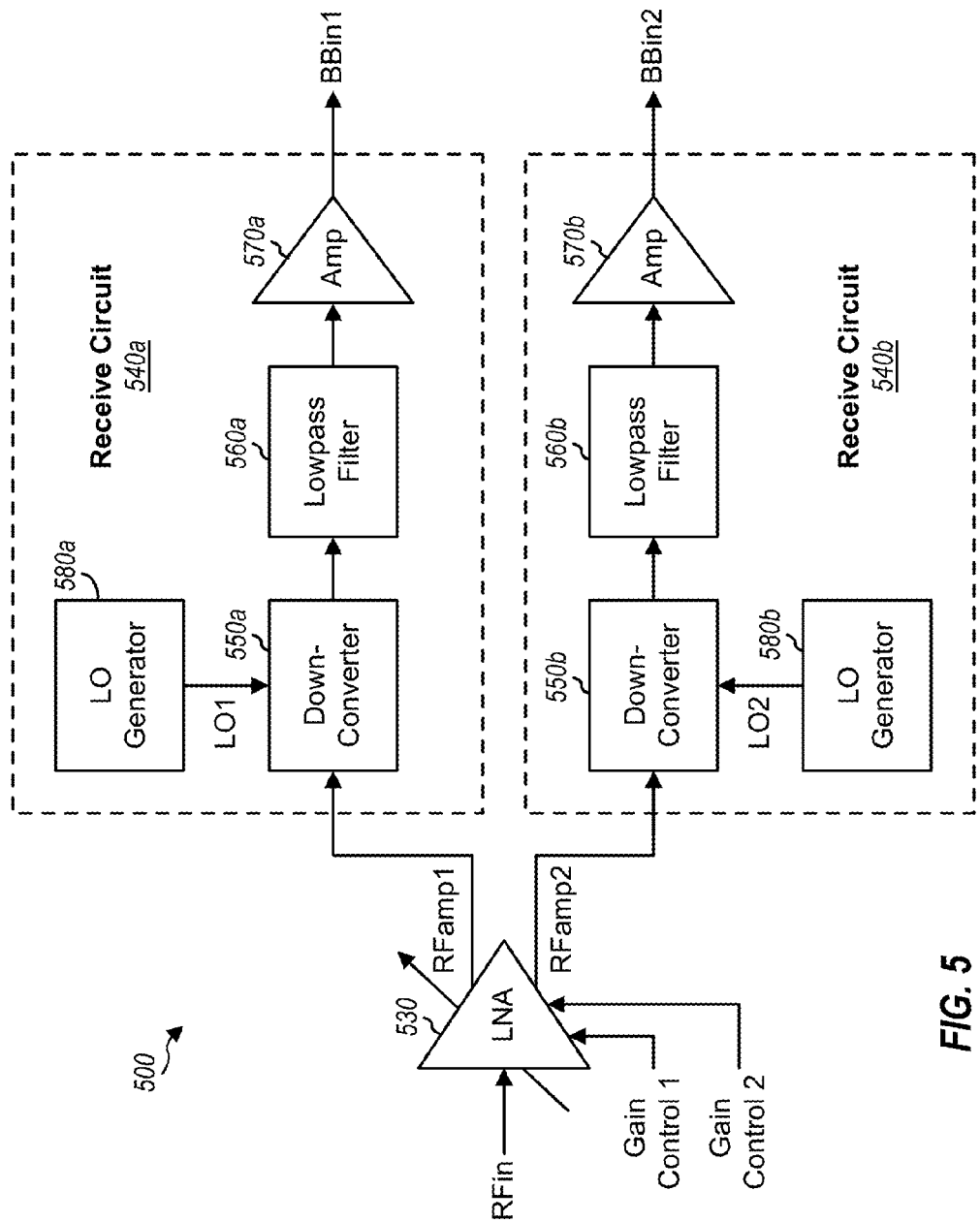
FIG. 5 show an exemplary design of a receiver with separate gain control for multiple transmitted signals being received.

FIG. 5 shows a block diagram of an exemplary design of a receiver 500 with separate gain control for different transmitted signals being received. In the exemplary design shown in FIG. 5, receiver 500 includes a SIMO LNA 530 and receive circuits 540a and 540b. Receiver 500 may be part of transceiver 320 or 322 in FIG. 3. LNA 530 may correspond to one of LNAs 330 or 332 in FIG. 3. Receive circuits 540a and 540b may be part of receive circuits 340 and/or 342 in FIG. 3.

In the exemplary design shown in FIG. 5, LNA 530 has an input receiving a input RF signal (RFin), a first output coupled to receive circuit 540a, and a second output coupled to receive circuit 540b. LNA 530 may amplify the RFin signal with a first variable gain to generate a first amplified RF signal (RFamp1), which may be provided to receive circuit 540a. Alternatively or additionally, LNA 530 may amplify the RFin signal with a second variable gain to generate a second amplified RF signal (RFamp2), which may be provided to receive circuit 540b.

Each receive circuit 540 may receive its amplified RF signal from LNA 530 and provide an input baseband signal to a data processor (e.g., data processor 380 in FIG. 3). Within receive circuit 540a, a downconverter 550a may receive the RFamp1 signal from LNA 530 and a first LO signal (LO1) from an LO generator 580a, downconvert the RFamp1 signal with the LO1 signal, and provide a downconverted signal. The frequency of the LO1 signal may be selected based on the frequency of each transmitted signal being received by receive circuit 540a. A lowpass filter 560a may filter the downconverted signal to remove undesirable signal components resulting from frequency downconversion and may provide a filtered signal. Lowpass filter 560a may have a bandwidth that may be determined based on the bandwidth of each transmitted signal being received by receive circuit 540a. An amplifier (Amp) 570a may amplify the filtered signal and provide an input baseband signal (BBin1). The input baseband signal may be digitized by ADCs within the data processor and further digitally processed (e.g., demodulated and decoded) to recover data sent to wireless device 110.

Receive circuit 540b may include a downconverter 550b, a lowpass filter 560b, an amplifier 570b, and an LO generator 580b, which may operate in similar manner as the corresponding circuits in receive circuit 540a.

FIG. 5 shows an exemplary design of receive circuits 540a and 540b. In general, the conditioning of the signals in a receive circuit may be performed by one or more stages of amplifier, filter, mixer, etc. These circuits may be arranged differently from the configuration shown in FIG. 5. Furthermore, other circuits not shown in FIG. 5 may be used in a receive circuit. Some circuits in FIG. 5 may also be omitted. A receiver may also include more than two receive circuits to concurrently process more than two sets of transmitted signal(s).

In an exemplary design, receive circuits 540a and 540b may concurrently process an input RF signal for multiple transmitted signals on two sets of carriers for carrier aggregation. In another exemplary design, receive circuits 540a and 540b may concurrently process an input RF signal for multiple transmitted signals (i) from a single wireless system for concurrent voice and data or (ii) from multiple wireless systems for data/data, voice/voice, etc.

A SIMO LNA with separate gain per output may be implemented with various circuit architectures. Some exemplary circuit architectures for a SIMO LNA with separate gain per output are described below.

Figure 6A:
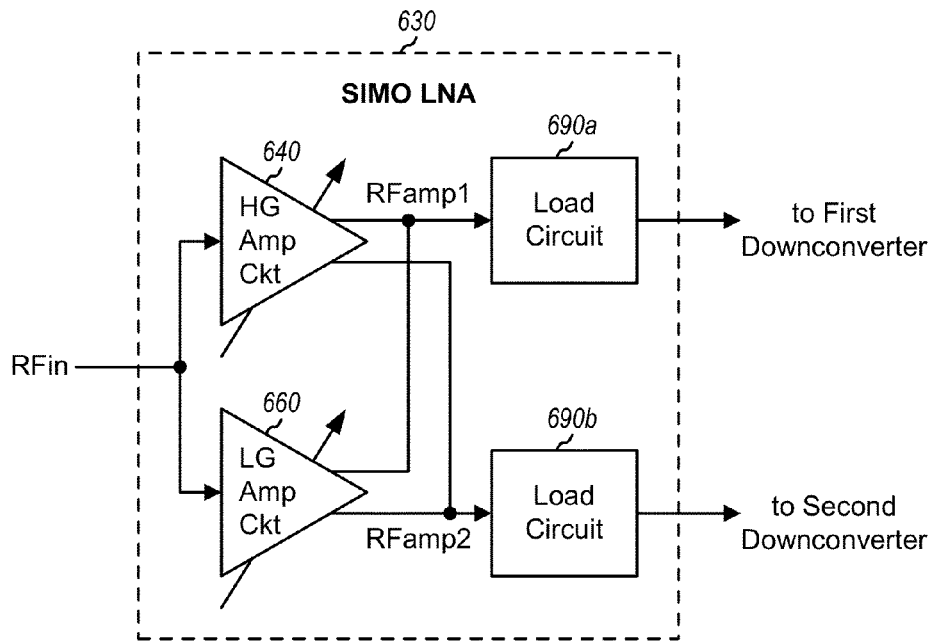
FIGS. 6A and 6B show two exemplary designs of a single-input multiple-output (SIMO) LNA with separate gain control for each of two outputs.

FIG. 6A shows a block diagram of an exemplary design of a SIMO LNA 630 with separate gain control for each of two outputs. LNA 630 includes two amplifier circuits 640 and 660 coupled to two load circuits 690a and 690b. An amplifier circuit is a circuit that, when enabled, receives and amplifies an input RF signal and provides at least one amplified RF signal. Amplifier circuit 640 has its input receiving an input RF signal, its first output coupled to load circuit 690a, and its second output coupled to load circuit 690b. Similarly, amplifier circuit 660 has its input receiving the same input RF signal, its first output coupled to load circuit 690a, and its second output coupled to load circuit 690b. Amplifier circuits 640 and 660 may provide up to two amplified RF signals to up to two load circuits 690a and 690b. In general, an amplifier circuit may include (i) an input that receives an input RF signal and (ii) one or more outputs that provide one or more amplified RF signals to one or more load circuits.

Figure 6B:
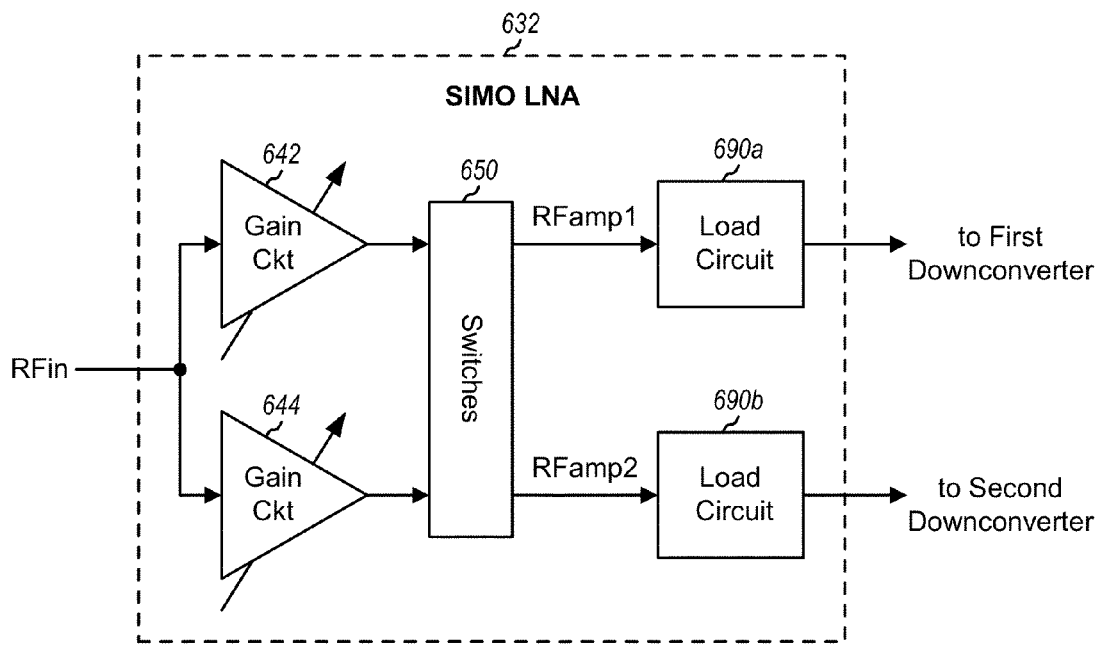

FIG. 6B shows a block diagram of an exemplary design of a SIMO LNA 632 with separate gain control for each of two outputs. LNA 632 includes two gain circuits 642 and 644 that receive the same input RF signal and provide two amplified signals. Switches 650 couple the two amplified signals from gain circuits 642 and 644 to two load circuits 690a and 690b. Switches 650 may be implemented with cascode transistors and may couple each gain circuit to one or both of load circuits 690a and 690b. Switches 650 may also enable or disable each output of LNA 632. Load circuits 690a and 690b provide up to two output RF signals to up to two downconverters.

FIG. 5 shows an exemplary design of SIMO LNA 530 having two outputs coupled to two receive circuits 540a and 540b. FIG. 6A shows an exemplary design of SIMO LNA 630 including two amplifier circuits, with each amplifier circuit having two outputs to generate up to two amplified signals for up to two downconverters. In general, a SIMO LNA may have any number of outputs coupled to any number of receive circuits. A SIMO LNA may also include any number of amplifier circuits. Each amplifier circuit may include any number of outputs, and each output may have a fixed gain or a variable gain.

A SIMO LNA may be implemented with transistors of various types. Some exemplary designs of a SIMO LNA implemented with N-channel metal oxide semiconductor (NMOS) transistors are described below.

Figure 7A:
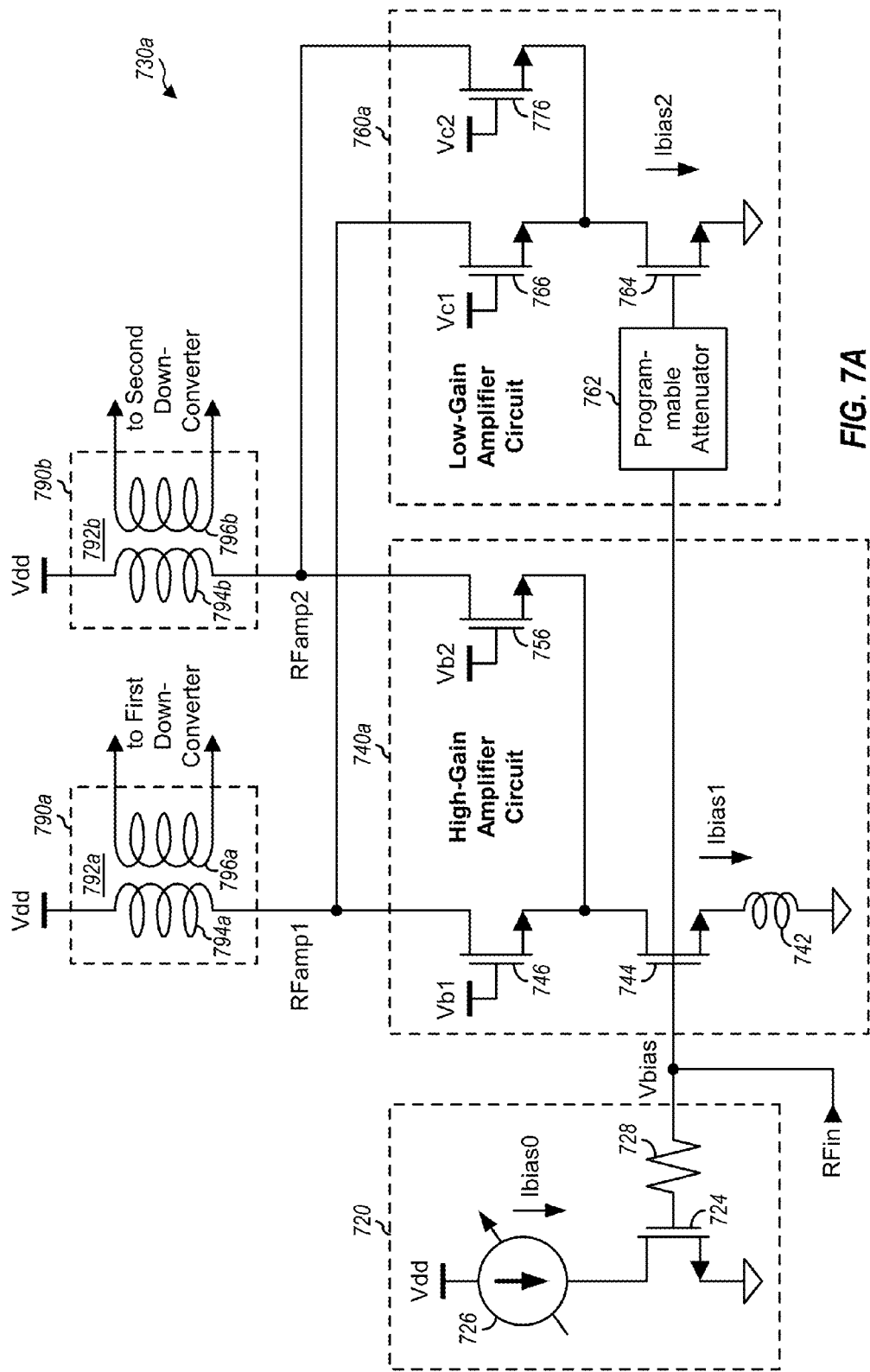
FIGS. 7A to 7D show four exemplary designs of a SIMO LNA with separate gain control for each LNA output

FIG. 7A shows a schematic diagram of an exemplary design of a SIMO LNA 730a with cascode-level signal splitting and separate gain control for each LNA output. SIMO LNA 730a is one exemplary design of SIMO LNA 530 in FIG. 5 and SIMO LNA 630 in FIG. 6A. SIMO LNA 730a includes a high-gain (HG) amplifier circuit 740a and a low-gain (LG) amplifier circuit 760a coupled to load circuits 790a and 790b. A high-gain amplifier circuit may have higher gain and possibly lower/better noise figure (NF), at least relative to a low-gain amplifier circuit. A low-gain amplifier circuit may have lower gain and possibly better/higher linearity, at least relative to a high-gain amplifier circuit.

SIMO LNA 730a receives an input RF signal, which is applied to both amplifier circuits 740a and 760a. The input RF signal may include transmissions on one or two sets of carriers for carrier aggregation, with each set including one or more carriers. Alternatively, the input RF signal may include two or more transmitted signals sent concurrently by one or more wireless systems to wireless device 110.

In the exemplary design shown in FIG. 7A, amplifier circuit 740a includes a gain transistor 744, cascode transistors 746 and 756, and a source degeneration inductor 742. Gain transistor 744 has its gate receiving the input RF signal, its source coupled to one end of inductor 742, and its drain coupled to the sources of cascode transistors 746 and 756. The other end of inductor 742 is coupled to circuit ground. Cascode transistor 746 has its gate receiving a Vb1 control signal and its drain coupled to load circuit 790a. Cascode transistor 756 has its gate receiving a Vb2 control signal and its drain coupled to load circuit 790b.

In the exemplary design shown in FIG. 7A, amplifier circuit 760a includes a programmable attenuator 762, a gain transistor 764, and cascode transistors 766 and 776. Attenuator 762 has its input receiving the input RF signal and its output coupled to the gate of gain transistor 764. Gain transistor 764 has its source coupled to circuit ground and its drain coupled to the sources of cascode transistors 766 and 776. Cascode transistor 766 has its gate receiving a Vc1 control signal and its drain coupled to load circuit 790a. Cascode transistor 776 has its gate receiving a Vc2 control signal and its drain coupled to load circuit 790b.

In the exemplary design shown in FIG. 7A, a bias circuit 720 includes an NMOS transistor 724, a current source 726, and a resistor 728. NMOS transistor 724 has its gate coupled to one end of resistor 728, its source coupled to circuit ground, and its drain coupled to one end of current source 726. The other end of current source 726 is coupled to a power supply (Vdd). The other end of resistor is coupled to the gate of gain transistor 744 and programmable attenuator 762.

Bias circuit 720 generates a bias voltage (Vbias) such that a current of Ibias0 flows through transistor 724. The Vbias voltage is applied to the gate of gain transistor 744 and results in a bias current of Ibias1 flowing through gain transistor 744. Ibias1 is dependent on Ibias0 as well as the ratio of the size of transistor 744 to the size of transistor 724. The Vbias voltage may be generated to account for a voltage drop across inductor 742. The Vbias voltage may also be generated based on a tradeoff between noise figure, linearity, and power consumption.

Amplifier circuits 740a and 760a and bias circuit 720 may also be implemented in other manners. In another exemplary design, an amplifier circuit may include a gain transistor having its source coupled directly to circuit ground (instead of to a source degeneration inductor). In yet another exemplary design, an amplifier circuit may include a feedback circuit coupled between an input and an output of the amplifier circuit. In yet another exemplary design, an amplifier circuit may be implemented with a differential design and may receive a differential input signal and/or provide a differential output signal. For example, amplifier circuit 740a may be replicated, one copy of amplifier circuit 740a may receive a non-inverting input signal and provide an inverting output signal, and the other copy of amplifier circuit 740a may receive an inverting input signal and provide a non-inverting output signal.

In the exemplary design shown in FIG. 7A, each load circuit 790 includes a transformer 792 comprising a primary coil 794 and a secondary coil 796. A coil may also be referred to as an inductor coil, a winding, a conductor, etc. Within load circuit 790a, a transformer 792a includes (i) a primary coil 794a coupled between the drain of cascode transistor 746 and the Vdd supply and (ii) a secondary coil 796a providing a first differential amplified RF signal to a first downconverter (not shown in FIG. 7A). Load circuit 790b includes a transformer 792b having (i) a primary coil 794b coupled between the drain of cascode transistor 756 and the Vdd supply and (ii) a secondary coil 796b providing a second differential amplified RF signal to a second downconverter (not shown in FIG. 7A). Each downconverter may include two mixers to perform quadrature downconversion of an amplified RF signal from RF to baseband or an intermediate frequency.

Load circuits 790 may also be implemented in other manners. In another exemplary design, a load circuit may include an inductor and possibly a capacitor coupled between an output of an amplifier circuit and the Vdd supply. In yet another exemplary design, a load circuit may include a P-channel metal oxide semiconductor (PMOS) transistor having its source coupled to the Vdd supply and its drain coupled to the drain of a cascode transistor (e.g., cascode transistor 746). The PMOS transistor may provide an active load for the cascode transistor.

For simplicity, FIG. 7A shows SIMO LNA 730a including two amplifier circuits 740a and 760a, which are coupled to two load circuits 790a and 790b. A SIMO LNA may include more than two amplifier circuits coupled to more than two load circuits.

In an exemplary design, the gain of high-gain amplifier circuit 740a may be adjusted by varying the Ibias1 current flowing through gain transistor 744. This may be achieved by varying the Ibias0 current of current source 726, which may then result in an appropriate Vbias voltage being generated for gain transistor 744 such that the desired Ibias1 current flows through gain transistor 744.

In an exemplary design, the gain of low-gain amplifier circuit 760a may be adjusted by varying programmable attenuator 762. For example, programmable attenuator 762 may include a resistive divider circuit comprising two resistors coupled in series, as described below. A variable gain may be obtained by varying one or both resistors in the resistive divider circuit.

SIMO LNA 730a may operate in a single-output configuration or a multi-output configuration. Furthermore, SIMO LNA 730a may operate in a high-gain (HG) mode or a low-gain (LG) mode in the single-output configuration. SIMO LNA 730a may operate in a HG-HG mode, a HG-LG mode, or a LG-LG mode in the multi-output configuration. In the description herein, an "XX" mode refers to an operating mode of the single-output configuration providing a single amplified RF signal having a gain of XX, where "XX" may be HG or LG. A "YY-ZZ" mode refers to an operating mode of the multi-output configuration providing two amplified RF signals, with one amplified RF signal having a gain of YY and the other amplified RF signal having a gain of ZZ, where "YY" may be HG or LG, and "ZZ" may also be HG or LG. Table 1 lists the configurations and modes supported by SIMO LNA 730a and provides a short description of each mode for each configuration, in accordance with one exemplary design.

TABLE 1

| Configuration | Mode | Description |
| --- | --- | --- |
| Single-Output Configuration | HG Mode | Amplifier circuit 740a is enabled to provide either RFamp1 or RFamp2 signal via one load circuit. Amplifier circuit 760a is disabled. |
| | LG Mode | Amplifier circuit 760a is enabled to provide either RFamp1 or RFamp2 signal via one load circuit. Amplifier circuit 740a is disabled. |
| Multi-Output Configuration | HG-HG Mode | Amplifier circuit 740a is enabled to provide both RFamp1 and RFamp2 signals via two load circuits. Amplifier circuit 760a is disabled. |
| | HG-LG Mode | Amplifier circuit 740a is enabled to provide one RFamp signal via one load circuit. Amplifier circuit 760a is enabled to provide another RFamp signal via another load circuit. |
| | LG-LG Mode | Amplifier circuit 760a is enabled to provide both RFamp1 and RFamp2 signals via two load circuits. Amplifier circuit 740a is disabled. |

For cascode-level signal splitting shown in FIG. 7A, the input RF signal may be amplified by gain transistor 744 and split by cascode transistors 746 and 756 to generate up to two amplified RF signals for up to two load circuits. Cascode transistor 746 may be enabled to generate the RFamp1 signal in the HG mode, the HG-HG mode, or the HG-LG mode. Cascode transistor 756 may be enabled to generate the RFamp2 signal in the HG mode, the HG-HG mode, or the HG-LG mode. Similarly, the input RF signal may be amplified by gain transistor 764 and split by cascode transistors 766 and 776 to generate up to two amplified RF signals for up to two load circuits. Cascode transistor 766 may be enabled to generate the RFamp1 signal in the LG mode, the HG-LG mode, or the LG-LG mode. Cascode transistor 776 may be enabled to generate the RFamp2 signal in the LG mode, the LG-HG mode, or the LG-LG mode.

In the single-output configuration, SIMO LNA 730a receives the input RF signal and provides one amplified RF signal to one load circuit 790. The single-output configuration may be used to receive (i) a transmission on one carrier without carrier aggregation, or (ii) transmissions on one set of carriers among transmissions on multiple sets of carriers in different bands for inter-band CA, or (iii) a transmitted signal from one wireless system. In the multi-output configuration, SIMO LNA 730a receives the input RF signal and provides two amplified RF signals to two load circuits 790. The multi-output configuration may be used to receive (i) transmissions on two sets of carriers for intra-band CA or (ii) two transmitted signals from one or two wireless systems.

Figure 7B:
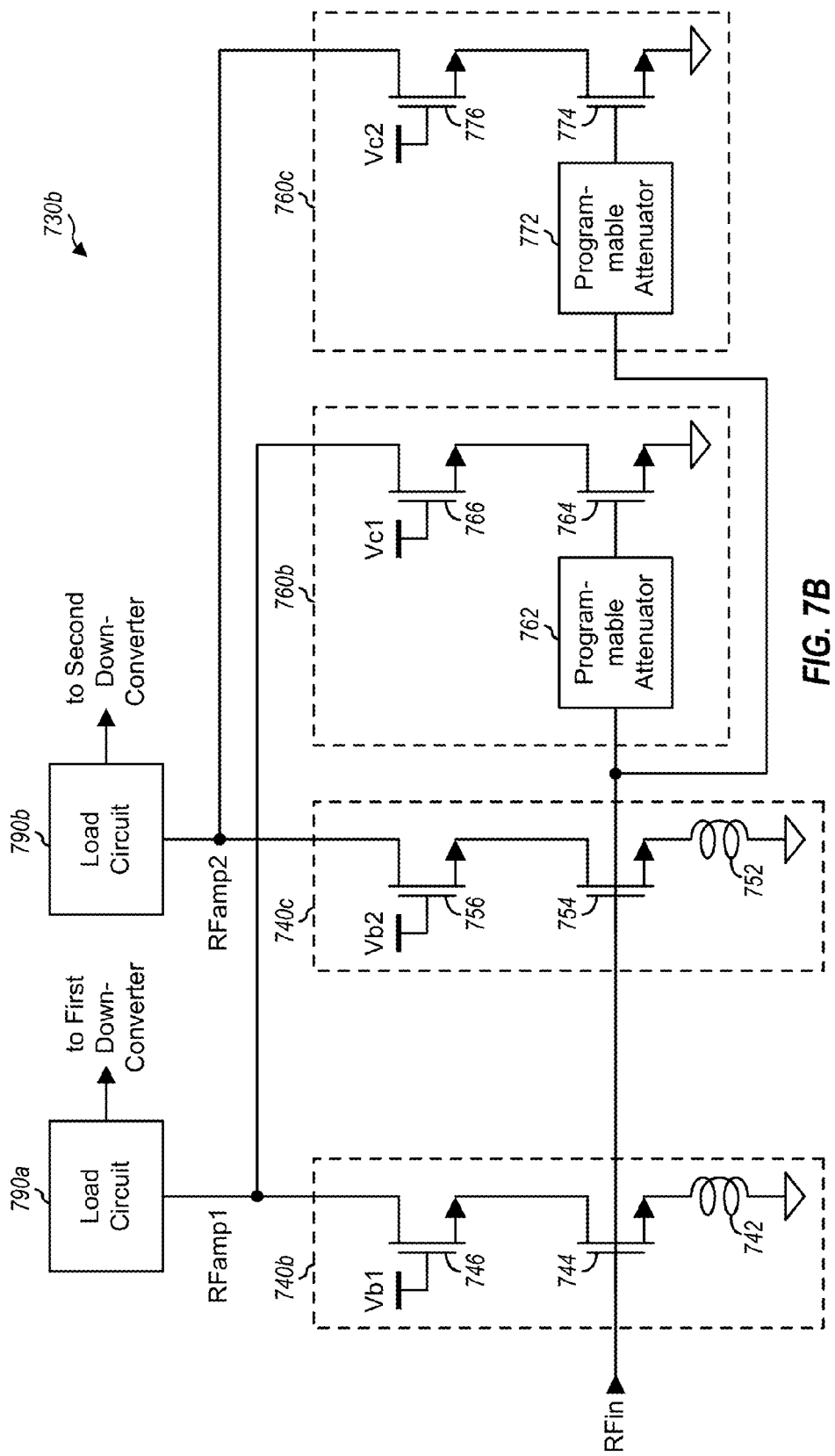

FIG. 7B shows a schematic diagram of an exemplary design of a SIMO LNA 730b with gate-level signal splitting and separate gain control for each LNA output. SIMO LNA 730b is another exemplary design of SIMO LNA 530 in FIG. 5 and SIMO LNA 630 in FIG. 6A. SIMO LNA 730b includes high-gain amplifier circuits 740b and 740c and low-gain amplifier circuits 760b and 760c, which are coupled to load circuits 790a and 790b.

In the exemplary design shown in FIG. 7B, high-gain amplifier circuit 740b includes gain transistor 744, cascode transistor 746, and inductor 742, which are coupled to load circuit 790a as described above for FIG. 7A. High-gain amplifier circuit 740c includes a gain transistor 754, a cascode transistor 756, and an inductor 752, which are coupled to load circuit 790b in similar manner as gain transistor 744, cascode transistor 746, and inductor 742 in amplifier circuit 740b. Gain transistors 744 and 754 receive the same RFin signal. Cascode transistor 746 has its gate receiving a Vb1 bias voltage and its drain coupled to load circuit 790a. Cascode transistor 756 has its gate receiving a Vb2 bias voltage and its drain coupled to load circuit 790b.

In the exemplary design shown in FIG. 7B, low-gain amplifier circuit 760b includes programmable attenuator 762, gain transistor 764, and cascode transistor 766, which are coupled to load circuit 790a as described above for FIG. 7A. Low-gain amplifier circuit 760c includes a programmable attenuator 772, a gain transistor 774, and a cascode transistor 776, which are coupled to load circuit 790b in similar manner as programmable attenuator 762, gain transistor 764, and cascode transistor 766 in amplifier circuit 760b. Programmable attenuators 762 and 772 receive the same RFin signal. Cascode transistor 766 has its gate receiving a Vc1 bias voltage and its drain coupled to load circuit 790a. Cascode transistor 776 has its gate receiving a Vc2 bias voltage and its drain coupled to load circuit 790b.

In the gate-level signal splitting design shown in FIG. 7B, the input RF signal may be amplified by gain transistor 744 and/or 754 and buffered by cascode transistor 746 and/or 756 in high-gain amplifier circuit 740b and/or 740c to generate up to two amplified RF signals for up to two load circuits. Cascode transistor 746 may be enabled to generate the RFamp1 signal in the HG mode, the HG-HG mode, or the HG-LG mode. Similarly, cascode transistor 756 may be enabled to generate the RFamp2 signal in the HG mode, the HG-HG mode, or the HG-LG mode.

The input RF signal may be scaled by programmable attenuator 762 and/or 772, amplified by gain transistor 764 and/or 774, and buffered by cascode transistor 766 and/or 776 in low-gain amplifier circuit 760*b* and/or 760*c* to generate up to two amplified RF signals for up to two load circuits. Cascode transistor 766 may be enabled to generate the RFamp1 signal in the LG mode, the HG-LG mode, or the LG-LG mode. Similarly, cascode transistor 776 may be enabled to generate the RFamp2 signal in the LG mode, the HG-LG mode, or the LG-LG mode.

The exemplary design shown in FIG. 7B includes two low-gain amplifier circuits 760*b* and 760*c* with separate programmable attenuators 762 and 772, respectively. This exemplary design allows the RFamp1 and RFamp2 signals to be generated with separate gains in the LG-LG mode. In another exemplary design, programmable attenuator 772 may be omitted, and the gates of gain transistors 764 and 774 may be coupled to the output of programmable attenuator 762. In this exemplary design, the RFamp1 and RFamp2 signals may be generated with the same gain in the LG-LG mode, and this gain may be adjusted via programmable attenuator 762.

Figure 7C:
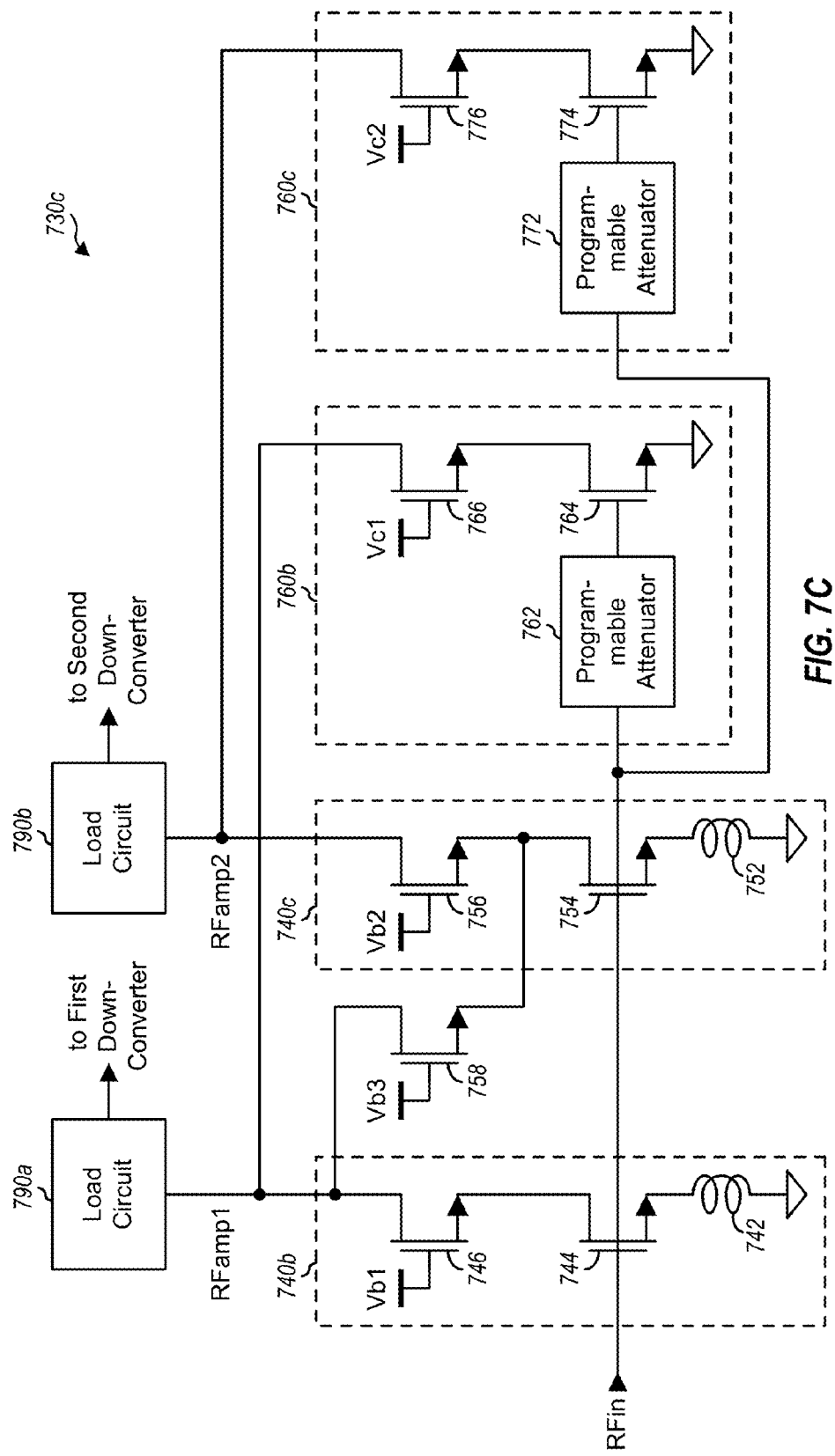

FIG. 7C shows a schematic diagram of an exemplary design of a SIMO LNA 730*c* with separate gain control for each LNA output. SIMO LNA 730*c* is yet another exemplary design of SIMO LNA 530 in FIG. 5 and SIMO LNA 630 in FIG. 6A. SIMO LNA 730*c* includes high-gain amplifier circuits 740*b* and 740*c* and low-gain amplifier circuits 760*b* and 760*c*, which are coupled to load circuits 790*a* and 790*b* as described above for FIG. 7B. SIMO LNA 730*c* further includes a cascode transistor 758 having its gate receiving a Vb3 control signal, its source coupled to the drain of gain transistor 754, and its drain coupled to the drain of cascode transistor 746. Cascode transistor 758 is a cascode divert switch that can steer current from gain transistor 754 to the RFamp1 signal when cascode transistor 758 is turned ON.

In the exemplary design shown in FIG. 7C, cascode transistors 746 and 756 may be turned ON, and cascode transistor 758 may be turned OFF to generate the RFamp1 and RFamp2 signals in the HG-HG mode. Cascode transistors 746 and 758 may be turned ON, and cascode transistor 756 may be turned OFF to generate the RFamp1 signal in the HG mode or the HG-LG mode. The use of both gain transistors 744 and 754 to generate one amplified RF signal may result in a higher gain due to RF current steering by divert cascode transistor 758.

In another exemplary design, an additional cascode transistor (not shown in FIG. 7C) may have its gate receiving a Vb4 control signal, its source coupled to the drain of gain transistor 744, and its drain coupled to the drain of cascode transistor 756. This additional cascode transistor and cascode transistor 756 may be turned ON to generate the RFamp2 signal in the HG mode or the HG-LG mode. This additional cascode transistor may operate in an analogous manner as cascode transistor 758 in order to improve signal gain for the RFamp2 signal.

Figure 7D:
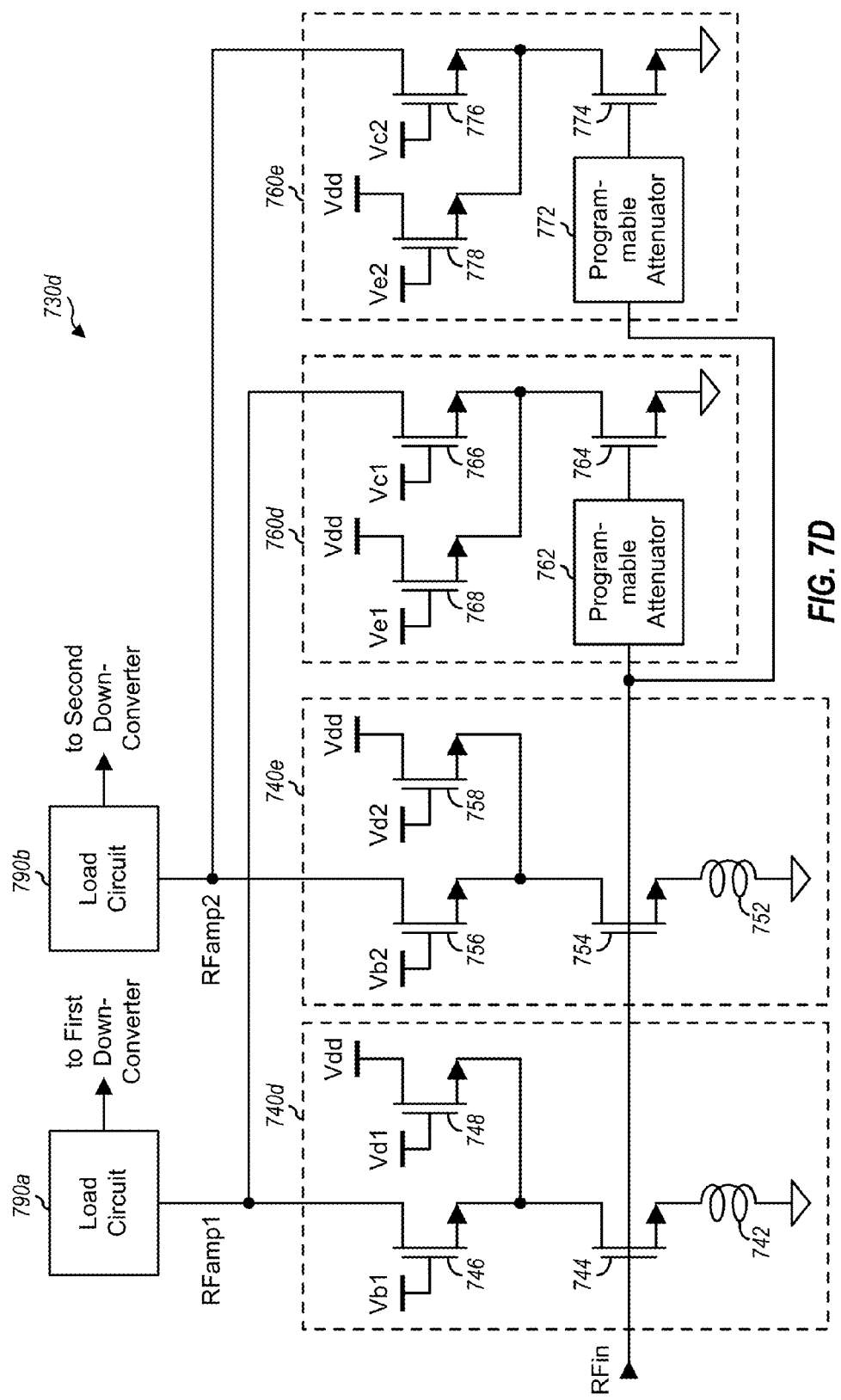

FIG. 7D shows a schematic diagram of an exemplary design of a SIMO LNA 730*d* with cascode bleeding and separate gain control for each LNA output. SIMO LNA 730*d* is yet another exemplary design of SIMO LNA 530 in FIG. 5 and SIMO LNA 630 in FIG. 6A. SIMO LNA 730*d* includes high-gain amplifier circuits 740*d* and 740*e* and low-gain amplifier circuits 760*d* and 760*e*, which are coupled to load circuits 790*a* and 790*b*. High-gain amplifier circuit 740*d* includes all of the circuit components in amplifier circuit 740*c* in FIG. 7C. High-gain amplifier circuit 740*d* further includes a "bleeding" cascode transistor 748 having its gate receiving a Vd1 control signal, its source coupled to the drain of gain transistor 744, and its drain coupled to the Vdd supply. High-gain amplifier circuit 740*e* further includes a bleeding cascode transistor 758 having its gate receiving a Vd2 control signal, its source coupled to the drain of gain transistor 754, and its drain coupled to the Vdd supply. Cascode transistors 748 and 758 are switches that can steer current from gain transistors 744 and 754, respectively, to the Vdd supply, which may then reduce the gains of the RFamp1 and RFamp2 signals, respectively. The signal paths associated with cascode transistors 748 and 758 are commonly referred to as "bleeding" paths. When amplifier circuit 740*d* is enabled, the gain and amplitude of the RFamp1 signal may be reduced (or increased) by turning ON cascode transistor 748 harder (or less hard). Similarly, amplifier circuit 740*e* is enabled, the gain and amplitude of the RFamp2 signal may be reduced (or increased) by turning ON cascode transistor 758 harder (or less hard).

Low-gain amplifier circuit 760*d* includes all of the circuit components in amplifier circuit 760*b* in FIG. 7C. Low-gain amplifier circuit 760*d* further includes a bleeding cascode transistor 768 having its gate receiving a Ve1 control signal, its source coupled to the drain of gain transistor 764, and its drain coupled to the Vdd supply. Low-gain amplifier circuit 760*e* includes all of the circuit components in amplifier circuit 760*c* in FIG. 7C. Low-gain amplifier circuit 760*e* further includes a bleeding cascode transistor 778 having its gate receiving a Ve2 control signal, its source coupled to the drain of gain transistor 774, and its drain coupled to the Vdd supply. When amplifier circuit 760*d* is enabled, the gain and amplitude of the RFamp1 signal may be reduced (or increased) by turning ON cascode transistor 768 harder (or less hard). Similarly, when amplifier circuit 760*e* is enabled, the gain and amplitude of the RFamp2 signal may be reduced (or increased) by turning ON cascode transistor 778 harder (or less hard).

FIG. 7D shows an exemplary design in which each amplifier circuits includes a bleeding cascode transistor. In general, a bleeding cascode transistor may be used in a high-gain amplifier circuit and/or a low-gain amplifier circuit. In another exemplary design, a bleeding cascode transistor may be used only in a low-gain amplifier circuit but not a high-gain amplifier circuit. A high-gain amplifier circuit may be designed to have good noise figure. A bleeding cascode transistor may degrade noise figure and may thus be omitted from a high-gain amplifier circuit. The gain of a high-gain amplifier circuit may be adjusted by changing the bias current, as described above.

FIGS. 7A to 7D show some exemplary designs of SIMO LNAs with separate gain control for each LNA output. A SIMO LNA with separate gain control for each LNA output may also be implemented in other manners. A SIMO LNA may support a number of operating modes, which may include single-output modes for generation of a single amplified RF signal and multi-output modes for generation of multiple amplified RF signals. Some multi-output modes may cover generation of multiple amplified RF signals with different gains for different amplified RF signals, and some other multi-output modes may cover generation of multiple amplified RF signals with a common gain for all amplified RF signals.

An amplifier circuit may support multiple gain settings, with each gain setting being associated with a different gain or a different range of gains. In an exemplary design, a high-gain amplifier circuit may support gain settings of G0, G1 and G2, and a low-gain amplifier circuit may support gain settings of G3, G4 and G5. A given gain setting (e.g., G2) may also be supported by both a high-gain amplifier circuit and a low-gain amplifier circuit. In general, an amplifier circuit may support any number of gain settings. Different amplifier circuits may support the same or different sets of gain settings.

Figure 8A:
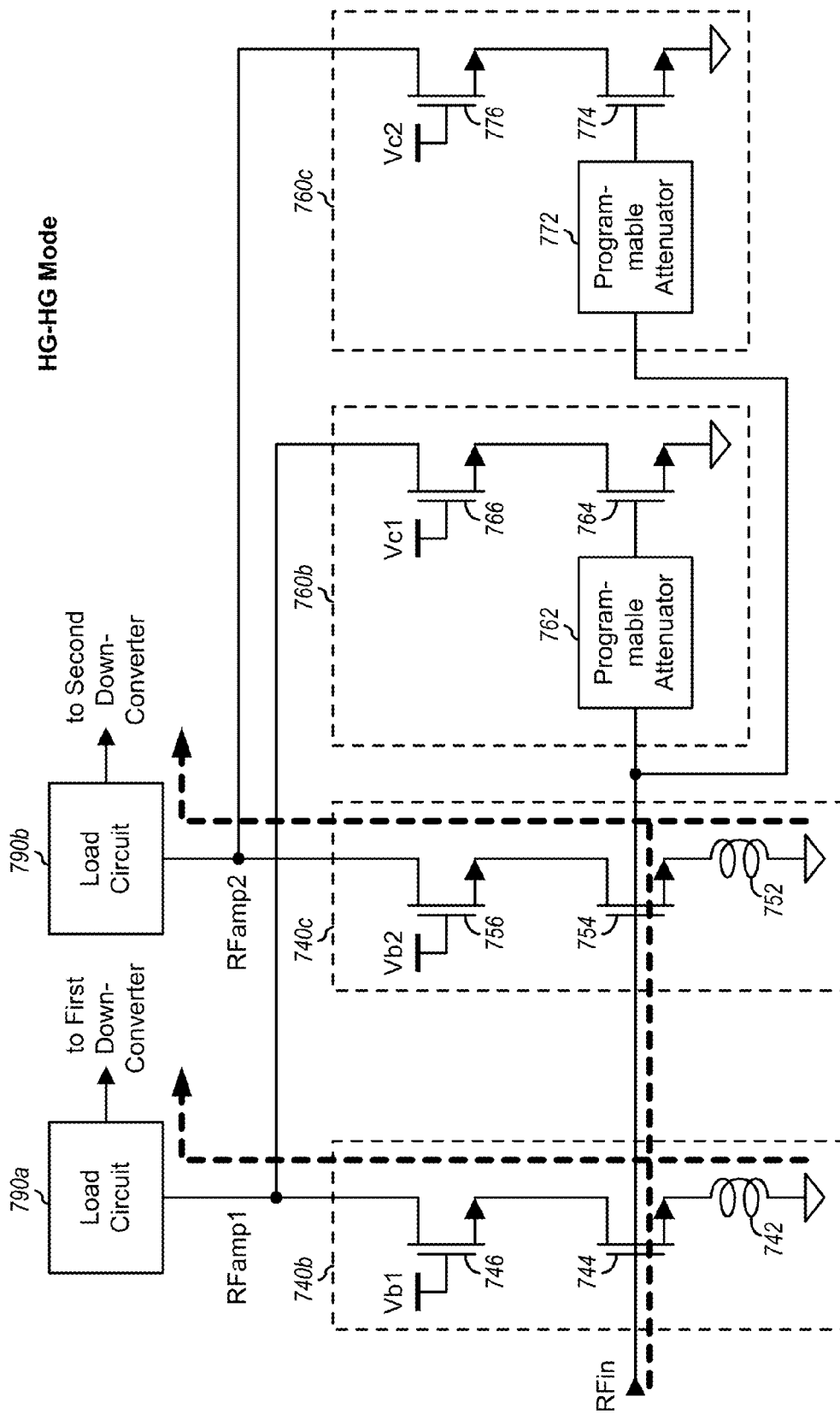

FIG. 8A shows operation of LNA 730b in FIG. 7B in the HG-HG mode. In this mode, high-gain amplifier circuit 740b may generate the RFamp1 signal for load circuit 790a with a selected gain setting (e.g., G1), and high-gain amplifier circuit 740c may generate the RFamp2 signal for load circuit 790b with the same selected gain setting. Low-gain amplifier circuits 760b and 760c may be disabled.

Figure 8B:
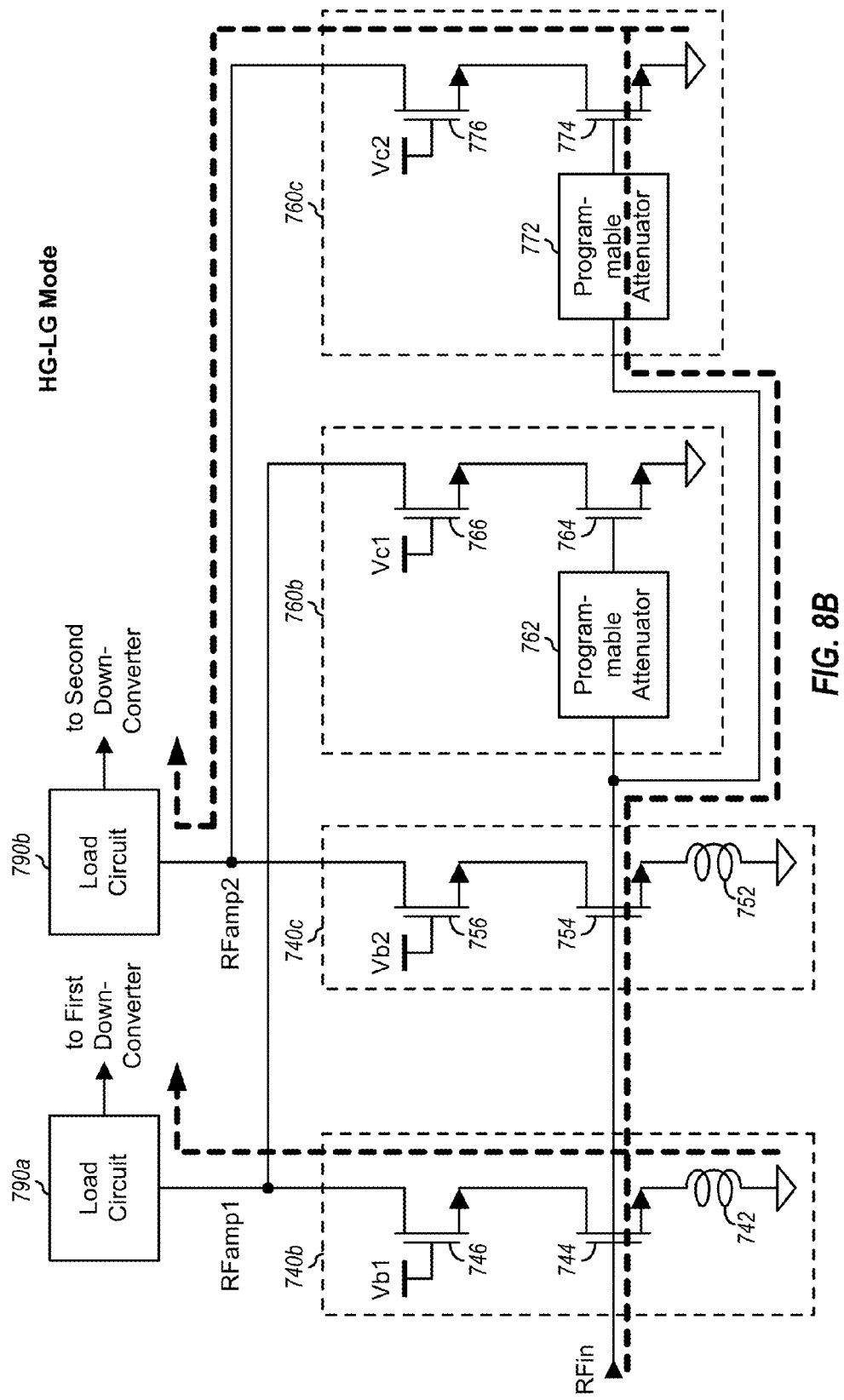

FIG. 8B shows operation of LNA 730b in FIG. 7B in the HG-LG mode. In this mode, high-gain amplifier circuit 740b may generate the RFamp1 signal for load circuit 790a with a first gain setting (e.g., G0 or G1), and low-gain amplifier circuit 760c may generate the RFamp2 signal for load circuit 790b with a second gain setting (e.g., G3, G4 or G5). Amplifier circuits 740c and 760b may be disabled. The input impedance of LNA 730b may be determined by the input impedance of high-gain amplifier circuit 740b. Programmable attenuators 762 and 772 may be set to obtain high input impedance for low-gain amplifier circuits 760b and 760c.

FIG. 8C shows operation of LNA 730b in FIG. 7B in the LG-LG mode. In this mode, low-gain amplifier circuit 760b may generate the RFamp1 signal for load circuit 790a with a first gain setting (e.g., G3), and low-gain amplifier circuit 760c may generate the RFamp2 signal for load circuit 790b with a second gain setting (e.g., G4 or G5). The same gain setting or different gain settings may be used for low-gain amplifier circuits 760b and 760c. Amplifier circuits 740b and 740c may be disabled. The input impedance of LNA 730b may be determined by the input impedance of high-gain amplifier circuit 740b. Programmable attenuators 762 and 772 may be set to obtain the desired input impedance for LNA 730c.

Figure 9:
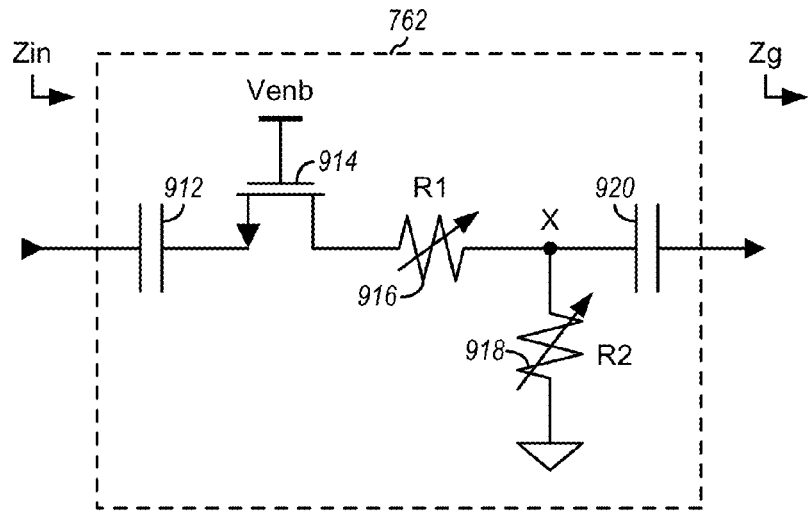
FIG. 9 shows an exemplary design of a programmable attenuator.

FIG. 9 shows a schematic diagram of an exemplary design of programmable attenuator 762 in FIGS. 7A to 7D. Within programmable attenuator 762, an alternating current (AC) coupling capacitor 912 is coupled between an input of programmable attenuator 762 and the source of an NMOS transistor 914. Transistor 914 has its gate receiving an enable signal (Venb) and its drain coupled to one end of a variable resistor 916. The other end of resistor 916 is coupled to node X. A variable resistor 918 is coupled between node X and circuit ground. An AC coupling capacitor 920 is coupled between node X and an output of programmable attenuator 762.

Within programmable attenuator 762, AC coupling capacitors 912 and 920 pass the input RF signal while avoiding disturbing the bias voltages of gain transistors coupled to the input and/or output of programmable attenuator 762.

In an exemplary design, capacitor 912 may operate as an isolation device that reduces variations of the input impedance of a SIMO LNA due to an amplifier circuit being enabled or disenabled. For example, SIMO LNA 730c in FIG. 7C may be designed such that the desired input impedance of LNA 730c is obtained based on the input impedance of high-gain amplifier circuits 740b and 740c. It may be desirable to maintain this input impedance of LNA 730c regardless of whether low-gain amplifier circuit 760b and/or 760c are enabled or disabled. A capacitor (e.g., corresponding to capacitor 912 in FIG. 9) within each of programmable attenuators 762 and 772 may operate as an isolation device. This capacitor may have a small value, which may be selected to (i) present a small load at the input of LNA 730c and (ii) pass the RFin signal to low-gain amplifier circuit 760b or 760c. The capacitor may also perform DC blocking. In other exemplary designs, a resistor, an inductor, a capacitor, and/or other circuit components may be used to isolate an amplifier circuit from loading an input of an LNA.

Referring back to FIG. 9, NMOS transistor 914 operates as a switch that can pass the input RF signal from the input to the output of programmable attenuator 762 when NMOS transistor 914 is enabled by the Venb signal. Resistors 916 and 918 form a resistor divider circuit that can provide a variable amount of attenuation based on the resistance of resistor 916 and the resistance of resistor 918. A desired amplitude of an attenuated RF signal at node X may be obtained with appropriate resistance settings for resistors 916 and/or 918. A desired input impedance (Zin) looking into programmable attenuator 762 may also be obtained with appropriate resistance settings for resistors 916 and/or 918. In particular, the attenuation and the input impedance of programmable attenuator 762 may be expressed as:

$$\text{Attenuation} = \frac{R2}{R1 + R2}, \quad \text{Eq (1)}$$

and $$Zin = R1 + \left(\frac{R2 * Zg}{R2 + Zg}\right), \quad \text{Eq (2)}$$

where R1 is the resistance of resistor 916, R2 is the resistance of resistor 918, and Zg is the impedance looking toward gate of a gain transistor to which programmable attenuator 762 is coupled.

FIG. 9 shows an exemplary design of programmable attenuator 762, which may also be implemented in other manners. A programmable attenuator may also be implemented based on other circuit designs, e.g., with a capacitive divider network instead of a resistive divider network. Programmable attenuator 772 in FIGS. 7B and 7C may be implemented in similar manner as programmable attenuator 762 or based on a different design. Programmable attenuators 762 and 772 may be identical, or may have the same circuit design and the same circuit components but different values, or may have different circuit designs with different circuit components.

In an exemplary design, an apparatus (e.g., a wireless device, an IC, a circuit module, etc.) may include first and second amplifier circuits (e.g., as shown in FIGS. 6A and 7A to 7D). The first amplifier circuit may receive and amplify an input RF signal based on a first variable gain and provide a first amplified RF signal. The second amplifier circuit may receive and amplify the input RF signal based on a second variable gain and provide a second amplified RF signal. The input RF signal may comprise a plurality of transmitted signals sent concurrently to a wireless device/apparatus. For example, the plurality of transmitted signals may be sent on a plurality of carriers to the wireless device for carrier aggregation, or may be sent by the same base station to the wireless device for concurrent voice and data, or may be sent by different base stations to the wireless device for CoMP transmission, or may be sent by different wireless systems for concurrent voice and/or data, etc. The first and second amplified RF signals may be processed concurrently by the apparatus to recover the plurality of transmitted signals.

In one exemplary design, the first variable gain may be adjustable independently of the second variable gain. The second variable gain may be different from (e.g., less than) the first variable gain, e.g., when the first and second amplifier circuits correspond to high-gain amplifier circuit 740*b* and low-gain amplifier circuit 760*b*, respectively, in FIG. 7C. In another exemplary design, the second variable gain may be equal to the first variable gain, e.g., when the first and second amplifier circuits correspond to high-gain amplifier circuits 740*b* and 740*c*, respectively, in FIG. 7C.

In one exemplary design, the first amplifier circuit may comprise a first gain transistor, a first inductor, and a first cascode transistor, e.g., similar to amplifier circuit 740*b* in FIG. 7C. The first gain transistor (e.g., gain transistor 744) may receive the input RF signal. The first inductor (e.g., inductor 742) may be coupled between the source of the first gain transistor and circuit ground. The first cascode transistor (e.g., cascode transistor 746) may be coupled to the first gain transistor and may be configurable to provide the first amplified RF signal.

In an exemplary design, a second cascode transistor (e.g., cascode transistor 756 in FIG. 7A) may be coupled to the first gain transistor and may be configurable to provide the second amplified RF signal when the first amplifier circuit is configured to provide both the first and second amplified RF signals. In another exemplary design, a second cascode transistor (e.g., cascode transistor 748 in FIG. 7D) may have its source coupled to the drain of the first gain transistor and its drain coupled to a supply voltage. The second cascode transistor may be enabled to reduce the first variable gain of the first amplifier circuit.

In an exemplary design, the apparatus may further comprise a bias circuit configurable to generate a bias voltage for the first gain transistor. The bias voltage may determine a bias current of the first gain transistor. The first variable gain may be determined based on the bias current of the first gain transistor.

In an exemplary design, the second amplifier circuit may comprise a second gain transistor, a second inductor, and a second cascode transistor, e.g., similar to amplifier circuit 740*c* in FIG. 7C. The second gain transistor (e.g., gain transistor 754) may receive the input RF signal. The second inductor (e.g., inductor 752) may be coupled between the source of the second gain transistor and circuit ground. The second cascode transistor (e.g., cascode transistor 756) may be coupled to the second gain transistor and may be configurable to provide the second amplified RF signal. In an exemplary design, a third cascode transistor (e.g., cascode transistor 758 in FIG. 7C) may have its source coupled to the drain of the second gain transistor and its drain coupled to the drain of the first cascode transistor. The third cascode transistor may be (i) disabled when the first and second cascode transistors are enabled or (ii) enabled when the first cascode transistor is enabled and the second cascode transistor is disabled.

In another exemplary design, the second amplifier circuit may comprise a programmable attenuator, a second gain transistor, and a second cascode transistor, e.g., similar to amplifier circuit 760*b* in FIG. 7C. The programmable attenuator (e.g., programmable attenuator 762) may receive the input RF signal and provide an attenuated RF signal. The second gain transistor (e.g., gain transistor 764) may be coupled to the programmable attenuator and may receive the attenuated RF signal. The second cascode transistor (e.g., cascode transistor 766) may be coupled to the second gain transistor and may be configurable to provide the second amplified RF signal.

In an exemplary design, the programmable attenuator may comprise first and second resistors and a switch, e.g., as shown in FIG. 9. The first resistor (e.g., resistor 916) may be coupled between an input and an output of the programmable attenuator. The second resistor (e.g., resistor 918) may be coupled between the first resistor and circuit ground. At least one of the first and second resistors may be adjustable to obtain variable attenuation of the input RF signal. The switch (e.g., transistor 914) may be coupled in series with the first resistor. The programmable attenuator may attenuate the input RF signal by a variable amount, which may be determined by the settings of the first and/or second resistors. The second variable gain of the second amplifier circuit may be determined based on the variable amount of attenuation by the programmable attenuator. The programmable attenuator may also be set to obtain (i) a target input impedance when the second amplifier circuit is enabled or (ii) a high input impedance when the second amplifier circuit is disabled.

In another exemplary design, the first amplifier circuit may comprise a first programmable attenuator, a first gain transistor, and a first cascode transistor, e.g., similar to amplifier circuit 760*b* in FIG. 7C. The first programmable attenuator (e.g., programmable attenuator 762) may receive the input RF signal and provide a first attenuated RF signal. The first gain transistor (e.g., gain transistor 764) may be coupled to the first programmable attenuator and may receive the first attenuated RF signal. The first cascode transistor (e.g., cascode transistor 766) may be coupled to the first gain transistor and may be configurable to provide the first amplified RF signal.

The second amplifier circuit may comprise a second programmable attenuator, a second gain transistor, and a second cascode transistor, e.g., similar to amplifier circuit 760*c* in FIG. 7C. The second programmable attenuator (e.g., programmable attenuator 772) may receive the input RF signal and provide a second attenuated RF signal. The second gain transistor (e.g., gain transistor 774) may be coupled to the second programmable attenuator and may receive the second attenuated RF signal. The second cascode transistor (e.g., cascode transistor 776) may be coupled to the second gain transistor and may be configurable to provide the second amplified RF signal.

In an exemplary design, the apparatus may further comprise a third amplifier circuit, which may be configurable to receive and amplify the input RF signal with the first variable gain and provide the second amplified RF signal. In this exemplary design, the first and third amplifier circuits may correspond to amplifier circuits 740*b* and 740*c* having the first variable gain in FIG. 7C, and the second amplifier circuit may correspond to amplifier circuit 760*b*. The first and second amplifier circuits may be enabled to generate the first and second amplified RF signals in a first mode (e.g., the HG-LG mode). The first and third amplifier circuits may be enabled to generate the first and second amplified RF signals in a second mode (e.g., the HG-HG mode).

In another exemplary design, the apparatus may further comprise a third amplifier circuit, which may be configurable to receive and amplify the input RF signal with a third variable gain and provide the first amplified RF signal. In this exemplary design, the first amplifier circuit may correspond to amplifier circuit 740*b* in FIG. 7C, the second amplifier circuit may correspond to amplifier circuit 760*b*, and the third amplifier circuit may correspond to amplifier circuit 760*c*. The first and second amplifier circuits may be enabled to generate the first and second amplified RF signals in a first mode (e.g., the HG-LG mode). The second and third amplifier circuits may be enabled to generate the first and second amplified RF signals in a second mode (e.g., the LG-LG mode).

Figure 10:
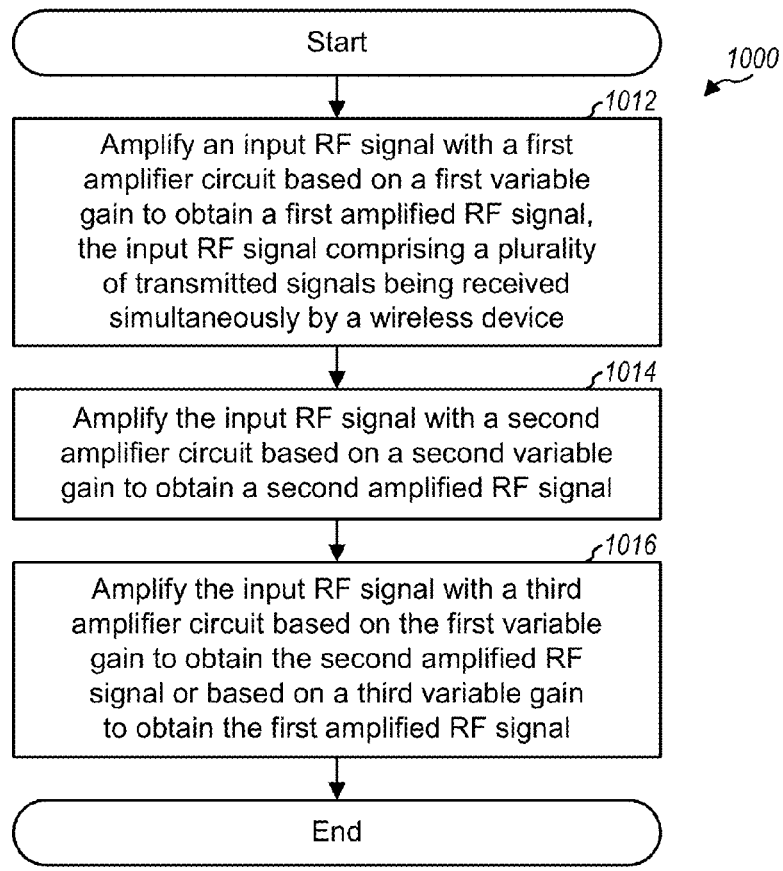
FIG. 10 shows a process for receiving multiple transmitted signals.

FIG. 10 shows an exemplary design of a process 1000 for receiving of signals. Process 1000 may be performed by a wireless device (as described below) or by some other entity. The wireless device may amplify an input RF signal with a first amplifier circuit based on a first variable gain to obtain a first amplified RF signal (block 1012). The input RF signal may comprise a plurality of transmitted signals sent concurrently to the wireless device. The wireless device may amplify the input RF signal with a second amplifier circuit based on a second variable gain to obtain a second amplified RF signal (block 1014).

The wireless device may amplify the input RF signal with a third amplifier circuit based on the first variable gain to obtain the second amplified RF signal (block 1016). Alternatively, the wireless device may amplify the input RF signal with the third amplifier circuit based on a third variable gain to obtain the first amplified RF signal (also block 1016). The first and second amplifier circuits may be enabled in a first mode. The first and third amplifier circuits may be enabled in a second mode.

The amplifiers (e.g., LNAs) with independent gain control per output described herein may be implemented on an IC, an analog IC, an RFIC, a mixed-signal IC, an ASIC, a printed circuit board (PCB), an electronic device, etc. The amplifiers may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the amplifiers described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
   a first amplifier circuit configured to receive an input radio frequency (RF) signal and to amplify the input RF signal based on a first variable gain to provide a first amplified RF signal, the input RF signal comprising a plurality of signals received by a wireless device;
   a second amplifier circuit configured to receive the input RF signal and to amplify the input RF signal based on a second variable gain to provide a second amplified RF signal; and
   a third amplifier circuit configured to receive the input RF signal and to amplify the input RF signal based on the first variable gain to provide a third amplified RF signal,
   wherein the first amplifier circuit, the second amplifier circuit, and the third amplifier circuit are included in a low noise amplifier (LNA) configured to receive the input RF signal, to output a first amplified output signal based on the first amplified RF signal during a first operating mode and during a second operating mode, to output a second amplified output signal based on the second amplified RF signal during the first operating mode, and to output the second amplified output signal based on the third amplified RF signal during the second operating mode.

2. The apparatus of claim 1, the first amplifier circuit comprising:
   a first gain transistor configured to receive the input RF signal;
   a first inductor coupled between a source of the first gain transistor and circuit ground; and
   a first cascode transistor coupled to the first gain transistor and configured to provide the first amplified RF signal.

3. The apparatus of claim 2, the third amplifier circuit comprising:
   a second gain transistor configured to receive the input RF signal;
   a second inductor coupled between a source of the second gain transistor and circuit ground; and
   a second cascode transistor coupled to the second gain transistor and configured to provide the third amplified RF signal.

4. The apparatus of claim 3, further comprising:
   a third cascode transistor, wherein a source of the third cascode transistor is coupled to a drain of the second gain transistor, and wherein a drain of the third cascode transistor is coupled to a drain of the first cascode transistor.

5. The apparatus of claim 2, the third amplifier circuit comprising:
   a second cascode transistor coupled to the first gain transistor, wherein the second cascode transistor is configured to provide the third amplified RF signal, and wherein the second amplified output signal is based on the third amplified RF signal when the second amplifier circuit is disabled.

6. The apparatus of claim 2, further comprising:
   a second cascode transistor, wherein a source of the second cascode transistor is coupled to a drain of the first gain transistor, wherein a drain of the second cascode transistor is coupled to a supply voltage, and wherein the second cascode transistor is configured to, when enabled, reduce the first variable gain.

7. The apparatus of claim 2, further comprising:
a bias circuit configured to generate a bias voltage applied to the first gain transistor, wherein a bias current associated with the first gain transistor is based on the bias voltage, and wherein the first variable gain is determined based on the bias current.

8. The apparatus of claim 2, the second amplifier circuit comprising:
a programmable attenuator configured to receive the input RF signal and to provide an attenuated RF signal based on the input RF signal;
a second gain transistor coupled to the programmable attenuator, wherein the second gain transistor is configured to receive the attenuated RF signal; and
a second cascode transistor coupled to the second gain transistor, wherein the second cascode transistor is configured to provide the second amplified RF signal.

9. The apparatus of claim 8, the programmable attenuator comprising:
a first resistor coupled between an input of the programmable attenuator and an output of the programmable attenuator;
a second resistor coupled between the first resistor and circuit ground, wherein at least one of the first resistor and the second resistor are adjustable resistors; and
a switch coupled in series with the first resistor.

10. The apparatus of claim 8, wherein an input impedance of the programmable attenuator is set to a target impedance value when the second amplifier circuit is enabled, and wherein the input impedance of the programmable attenuator is set to a high impedance value when the second amplifier circuit is disabled.

11. The apparatus of claim 1, the second amplifier circuit comprising:
a first programmable attenuator configured to receive the input RF signal and to provide a first attenuated RF signal based on the input RF signal;
a first gain transistor coupled to the first programmable attenuator, wherein the first gain transistor is configured to receive the first attenuated RF signal; and
a first cascode transistor coupled to the first gain transistor, wherein the first cascode transistor is configured to provide the second amplified RF signal.

12. The apparatus of claim 11, further comprising a fourth amplifier circuit configured to receive the input RF signal and to amplify the input RF signal based on a third variable gain to provide a fourth amplified RF signal, wherein the fourth amplifier circuit comprises:
a second programmable attenuator configured to receive the input RF signal and to provide a second attenuated RF signal based on the input RF signal;
a second gain transistor coupled to the second programmable attenuator, wherein the second gain transistor is configured to receive the second attenuated RF signal; and
a second cascode transistor coupled to the second gain transistor, wherein the second cascode transistor is configured to provide the fourth amplified RF signal.

13. The apparatus of claim 1, wherein the first amplifier circuit and the second amplifier circuit are enabled and the third amplifier circuit is disabled during the first operating mode, and wherein the first amplifier circuit and the third amplifier circuit are enabled and the second amplifier circuit is disabled during the second operating mode.

14. The apparatus of claim 1, further comprising:
a fourth amplifier circuit configured to receive the input RF signal and to amplify the input RF signal based on a third variable gain to provide a fourth amplified RF signal, wherein the fourth amplifier circuit is included in the LNA, and wherein the first amplified output signal is based on the fourth amplified RF signal during a third operating mode.

15. The apparatus of claim 14, wherein the first amplifier circuit and the third amplifier circuit are disabled during the third operating mode, and wherein the second amplifier circuit and the fourth amplifier circuit are enabled during the third operating mode.

16. The apparatus of claim 1, wherein the plurality of signals includes a first signal transmitted by a first carrier and a second signal transmitted by a second carrier, wherein the first carrier and the carrier are associated with the same frequency band, and wherein the first signal and the second signal are received from the same wireless system.

17. A method comprising:
amplifying, at a first amplifier circuit, an input radio frequency (RF) signal based on a first variable gain to provide a first amplified RF signal, the input RF signal comprising a plurality of signals received by a wireless device;
amplifying, at a second amplifier circuit, the input RF signal based on a second variable gain to provide a second amplified RF signal; and
amplifying, at a third amplifier circuit, the input RF signal based on the first variable gain to provide a third amplified RF signal,
wherein the first amplifier circuit, the second amplifier circuit, and the third amplifier circuit are included in a low noise amplifier (LNA) configured to receive the input RF signal, to output a first amplified output signal based on the first amplified RF signal during a first operating mode and during a second operating mode, to output a second amplified output signal based on the second amplified RF signal during the first operating mode, and to output the second amplified output signal based on the third amplified RF signal during the second operating mode.

18. The method of claim 17, further comprising:
disabling the second amplifier circuit during the third operating mode; and
disabling the third amplifier circuit during the first operating mode, wherein the LNA comprises a single-input, multiple-output (SIMO) LNA.

19. An apparatus comprising:
first means for amplifying an input radio frequency (RF) signal based on a first variable gain to provide a first amplified RF signal, the input RF signal comprising a plurality of signals being received by a wireless device;
second means for amplifying the input RF signal based on a second variable gain to provide a second amplified RF signal; and
third means for amplifying the input RF signal based on the first variable gain to provide a third RF signal,
wherein the first means for amplifying, the second means for amplifying, and the third means for amplifying are included in a low noise amplifier (LNA) configured to receive the input RF signal, to output a first amplified output signal based on the first amplified RF signal during the first operating mode and during a second operating mode, to output a second amplified output signal based on the second amplified RF signal during the first operating mode, and to output the second amplified output signal based on the third amplified RF signal during the second operating mode.

20. The apparatus of claim 19, further comprising:
fourth means for amplifying the input RF signal based on a third variable gain to provide a fourth amplified RF signal, wherein the first amplified output signal is based on the fourth amplified RF signal during a third operating mode.

* * * * *